(12) United States Patent
Hou et al.

(10) Patent No.: US 11,737,293 B2
(45) Date of Patent: Aug. 22, 2023

(54) ARTIFICIAL PHOTOSYNTHETIC DEVICES UTILIZING POLARITON ANTENNAS

(71) Applicant: The Regents of the University of Michigan, Ann Arbor, MI (US)

(72) Inventors: Shaocong Hou, Lu'An (CN); Stephen R. Forrest, Ann Arbor, MI (US); Bin Liu, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 17/666,664

(22) Filed: Feb. 8, 2022

(65) Prior Publication Data
US 2022/0271246 A1  Aug. 25, 2022

Related U.S. Application Data

(60) Provisional application No. 63/151,413, filed on Feb. 19, 2021.

(51) Int. Cl.
| | | |
|---|---|---|
| *H01L 31/00* | (2006.01) | |
| *H10K 30/87* | (2023.01) | |
| *H10K 30/30* | (2023.01) | |
| *H10K 30/81* | (2023.01) | |
| *H10K 71/20* | (2023.01) | |
| *H10K 85/20* | (2023.01) | |

(52) U.S. Cl.
CPC ............. *H10K 30/87* (2023.02); *H10K 30/30* (2023.02); *H10K 30/81* (2023.02); *H10K 71/221* (2023.02); *H10K 85/211* (2023.02)

(58) Field of Classification Search
CPC ............... H01L 51/447; H01L 51/0046; H01L 51/4253; H01L 51/441; H01L 51/0056; H01L 51/424; H01L 51/44; Y02E 10/549; H01Q 1/36
See application file for complete search history.

(56) References Cited

U.S. PATENT DOCUMENTS

| | | |
|---|---|---|
| 4,482,778 A | 11/1984 | Anderson |
| 4,629,821 A | 12/1986 | Bronstein-Bonte |

(Continued)

OTHER PUBLICATIONS

Aberra Guebrou, S. et al. Coherent emission from a disordered organic semiconductor induced by strong coupling with surface plasmons. Phys. Rev. Lett. 108, 1-5 (2012).

(Continued)

*Primary Examiner* — Angelo Trivisonno
(74) *Attorney, Agent, or Firm* — Riverside Law LLP

(57) ABSTRACT

An organic photovoltaic device comprises a substrate, a reflector positioned over the substrate, a first electrode positioned over at least a first portion of the reflector, a polaritonic antenna layer positioned over a second portion of the reflector different from the first portion, electrically connected to the first electrode, and at least one unit reaction cell positioned over at least part of the first electrode, the at least one unit reaction cell comprising a heterojunction layer comprising a donor material and an acceptor material, positioned over the first electrode, and a second electrode positioned over the heterojunction, wherein the polaritonic antenna and the reflector are configured to convert incoming photonic energy to polaritons. A method of fabricating an organic photovoltaic device is also disclosed.

13 Claims, 22 Drawing Sheets

(56) References Cited

U.S. PATENT DOCUMENTS

| | | | |
|---|---|---|---|
| 6,441,298 B1 | 8/2002 | Thio | |
| 8,866,000 B2 | 10/2014 | Didomenico | |
| 2007/0119496 A1* | 5/2007 | Baldo | B82Y 10/00 |
| | | | 136/252 |
| 2011/0226317 A1 | 9/2011 | Xu | |

OTHER PUBLICATIONS

Agranovich, V. M., Litinskaia, M. & Lidzey, D. G. Cavity polaritons in microcavities containing disordered organic semiconductors. Phys. Rev. B—Condens. Matter Mater. Phys. 67, 1-10 (2003).

Burlingame, Q., Huang, X., Liu, X. et al. Intrinsically stable organic solar cells under high-intensity illumination. Nature 573, 394-397 (2019).

Chervy, T. et al. High-Efficiency Second-Harmonic Generation from Hybrid Light-Matter States. Nano Lett. 16, 7352-7356 (2016).

Daskalakis, K. S. et al. Room-temperature superfluidity in a polariton condensate. Nat. Phys. 13, 837-841 (2017).

Genco, A. et al. Bright Polariton Coumarin-Based OLEDs Operating in the Ultrastrong Coupling Regime. Adv. Opt. Mater. 6, 1-6 (2018).

Heidel, T, et al., "Surface plasmon polariton mediated energy transfer in organic photovoltaic devices." Appl. Phys. Lett. 91, 093506 (2007).

Heidel, T. D., et al., Analysis of surface plasmon polariton mediated energy transfer in organic photovoltaic devices. Organic Photovoltaics VIII. (2007) 9 pages.

Holmes, R. J. & Forrest, S. R. Strong exciton-photon coupling in organic materials. Org. Electron. physics, Mater. Appl. 8, 77-93 (2007).

Hou, S. et al. Ultralong-Range Energy Transport in a Disordered Organic Semiconductor at Room Temperature via Coherent Exciton-Polariton Propagation. Adv. Mater. 32, 1-6 (2020).

Keeling, J. & Kéna-Cohen, S. Bose-einstein condensation of exciton-polaritons in organic microcavities. Annu. Rev. Phys. Chem. 71, 435-459 (2020).

Lerario, G. et al. High-speed flow of interacting organic polaritons. Light Sci. Appl. 6, 1-6 (2017).

Lidzey, D. G. et al. Strong exciton-photon coupling in an organic semiconductor microcavity. Nature 395, 53-55 (1998).

Liscidini, M., Gerace, D., Sanvitto, D. & Bajoni, D. Guided Bloch surface wave polaritons. Appl. Phys. Lett. 98, (2011). (3 pages).

Liu, B., Crescimanno, M., Twieg, R. J. & Singer, K. D. Dispersion of Third-Harmonic Generation in Organic Cavity Polaritons. Adv. Opt. Mater. 7, 1-8 (2019).

Liu, B., Menon, V. M. & Sfeir, M. Y. The Role of Long-Lived Excitons in the Dynamics of Strongly Coupled Molecular Polaritons. ACS Photonics 7, 2292-2301 (2020).

Nikolis, V. C. et al. Strong light-matter coupling for reduced photon energy losses in organic photovoltaics. Nat. Commun. 10, 1-8 (2019).

Polak, D. et al. Manipulating molecules with strong coupling: Harvesting triplet excitons in organic exciton microcavities. Chem. Sci. 11, 343-354 (2020).

Rozenman, G. G., Akulov, K., Golombek, A. & Schwartz, T. Long-Range Transport of Organic Exciton-Polaritons Revealed by Ultrafast Microscopy. ACS Photonics 5, 105-110 (2018).

Sanvitto, D. & Kéna-cohen, S. The road towards polaritonic devices. Nat. Publ. Gr. 15, (2016). (13 pages).

Stranius, K., Hertzog, M. & Börjesson, K. Selective manipulation of electronically excited states through strong light-matter interactions Nat. Commun. 9, 1-7 (2018).

Zasedatelev, A. V. et al. A room-temperature organic polariton transistor. Nat. Photonics 13, 378-383 (2019).

* cited by examiner

Anti-crossing dispersion

$$I_{LP}(x) = \int_0^d (\int_0^{\frac{\pi}{2}-\theta_c} E_{LP}(\theta)e^{-ik_{x1}x}(1 + e^{-i\Delta k_x x}e^{-i\varphi})d\theta)^2 e^{-\alpha x}dz,$$

$\Delta k_x = k_{x2} - k_{x1}$
$k$ broadening: $\sigma = \mu x$
attenuation coefficient: $\alpha$

ARTIFICIAL PHOTOSYNTHETIC DEVICES UTILIZING POLARITON ANTENNAS

CROSS-REFERENCE TO RELATED APPLICATIONS

This application claims priority to U.S. Provisional Application No. 63/151,413, filed on Feb. 19, 2021, incorporated herein by reference in its entirety.

STATEMENT REGARDING FEDERALLY SPONSORED RESEARCH OR DEVELOPMENT

This invention was made with government support under W911-NF-17-1-0312 awarded by the U.S. Army Research Office and DE-SC0017971, awarded by the Department of Energy. The government has certain rights in the invention.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, may be used to drive power consuming loads to provide, for example, lighting, heating, or to power electronic circuitry or devices such as calculators, radios, computers or remote monitoring or communications equipment. These power generation applications may involve the charging of batteries or other energy storage devices so that operation may continue when direct illumination from the sun or other light sources is not available, or to balance the power output of the PV device with the specific applications requirements.

Traditionally, photosensitive optoelectronic devices have been constructed of a number of inorganic semiconductors, e.g., crystalline, polycrystalline and amorphous silicon, gallium arsenide, cadmium telluride, and others.

More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or subcells.

In addition to the pursuit of high device efficiency, OPVs have unique advantages, such as the application of semi-transparent solar cells for use in building integrated photovoltaics (BIPV). Considering the vast surface areas of windows and facades in modern urban environments, developing semi-transparent solar cells with both high efficiency and transmittance has become increasingly important.

Natural photosynthesis, for example used by plants and bacteria, provides essential energy and chemicals for human beings and other life forms. With reference to FIG. 1A, a natural photosynthesis system consists of antenna pigment molecules and reaction center molecules. These molecules are packed in highly ordered molecular superstructures and energetic landscape, where the molecular antennas absorb incoming photons and efficiently transfer exciton energy resonantly over long distances toward one or more reaction centers where the excitons dissociate in a reaction center into electron and hole pairs with nearly unity quantum efficiency.

Many efforts have been made to mimic the natural photosynthesis process, for example using precise tailoring of molecular structure and assemblies in order to overcome the intrinsic material disorders that localize the photogenerated excitons. Unfortunately, very few of these existing efforts achieved any success.

Some existing methods attempt to use an exciton hopping model, like Dexter Exciton Transfer or Förster Exciton Transfer as shown in FIG. 1B. These Exciton transfer models are limited in their usefulness in artificial photosynthetic applications, because direct exciton transfer is limited by molecular distance.

Strong coupling of light and matter gives rise to new quasi-particles called exciton-polaritons with partial photon and partial matter character. Due to the large oscillator strength and binding energy of Frenkel excitons in organic materials, organic polaritons can yield large vacuum Rabi splitting energies at room temperature, and the hybrid light-matter characteristic of organic polaritons has made them attractive for observing diverse photophysical and dynamical phenomena, including nonlinear optical processes, polariton condensation, and superfluidity. Organic polaritons have been exploited in numerous photonic and optoelectronic device applications, such as organic photovoltaics (OPV), light-emitting devices (LEDs), and transistors. Among those enticing properties, due to the small effective mass and delocalization inherited from their photonic components, organic polaritons are potentially immune from interactions with local defects and disorder in molecular solids, which can lead to high-speed long-range excitation transport that is a vast improvement over slow and short-range exciton diffusion.

As discussed herein, organic exciton polaritons are hybrid quasi-particles arising from the strong coupling between a molecular excitonic transition with an electromagnetic mode see e.g. FIG. 2A), which have a characteristic anti-crossing energy-moment dispersion relation (see e.g. FIG. 2B), and they inherit the properties of both excitonic and photonic components. Among those promising features, exciton polaritons have the potential to enable longer-range energy transfer.

Conventional polaritonic structures employ planar microcavities where the optical active layer is embedded between one or more metallic mirrors or Distributed Bragg Reflectors (DBRs), and their relatively short lifetimes and low group velocities prohibit polariton propagation and energy transport over long distances. In addition, organic planar cavities with peculiar structural geometries are inconvenient and intractable for the realization of integrated polaritonic device applications. In one related work, a Bloch surface wave (BSW) supported by a truncated all-dielectric photonic structure was reported to strongly couple with organic excitons, which differs from other surface modes such as surface plasmons, as it does not undergo dissipation caused by metallic losses. In one embodiment, the propagating optical mode with high group velocity and low optical loss enables the formed organic polariton, which in some embodiments has a lifetime of 500 fs or more, to propagate for hundreds of microns. Together with the ease of fabrication and compatibility owing to the open structure geometry, this renders the BSW structure capable of realizing long-range transport applications in polaritonic systems. An exemplary BSW device structure is shown in FIG. 3A, in the example comprising a substrate 301 and a DBR 302, where the propagation, shown over long ranges and in-plane, is shown by the curve 304. A real-space PL image showing polariton propagation using a k-space filter is shown in FIG. 3B. The excitation laser spot is located at point (0,0) (311) denoted by a + sign. The dashed arrow indicates the propagation direction.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. A dendrimer may be a "small molecule," and it is believed that all dendrimers currently used in the field of organic opto-electronic devices are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of a material. A ligand may be referred to as "ancillary" when it is believed that the ligand does not contribute to the photoactive properties of a material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

SUMMARY OF THE INVENTION

In one aspect, an organic photovoltaic device comprises a substrate, a reflector positioned over the substrate, a first electrode positioned over at least a first portion of the reflector, a polaritonic antenna layer positioned over a second portion of the reflector different from the first portion, electrically connected to the first electrode, and at least one unit reaction cell positioned over at least part of the first electrode, the at least one unit reaction cell comprising a heterojunction layer comprising a donor material and an acceptor material, positioned over the first electrode, and a second electrode positioned over the heterojunction, wherein the polaritonic antenna and the reflector are configured to convert incoming photonic energy to polaritons.

In one embodiment, the second portion intersects the first portion. In one embodiment, the acceptor comprises fullerene. In one embodiment, the first electrode is an anode and the second electrode is a cathode. In one embodiment, the anode comprises gold and the cathode comprises silver. In one embodiment, the polaritonic antenna layer comprises tetraphenyldibenzoperiflanthene. In one embodiment, the reflector is a distributed Bragg reflector. In one embodiment, the distributed Bragg reflector comprises at least one pair of sublayers. In one embodiment, the at least one unit reaction cell comprises an array of unit reaction cells positioned at regular intervals over the first electrode.

In one embodiment, a space between each unit reaction cell in the array of unit reaction cells is between 100 µm and 1 mm. In one embodiment, the at least one unit reaction cell has a circular cross-sectional area. In one embodiment, the polaritonic antenna comprises the donor material. In one embodiment, the device further comprises an electron transport layer between the cathode and the heterojunction layer, and a hole transport layer between the anode and the heterojunction layer.

In one aspect, a method of making an organic photovoltaic cell comprises depositing a reflector on a substrate, depositing a lift-off resist layer and a photoresist layer over the reflector, positioning a mask having at least one aperture over the photoresist layer, transmitting ultraviolet light into the at least one aperture, removing a portion of the photoresist layer and the lift-off resist layer beneath the plurality of apertures, leaving a remainder of the photoresist layer and the lift-off resist layer, depositing an electrode material over the reflector, removing the remainder of the photoresist layer and the lift-off resist layer, leaving at least one electrode, positioning an etchable material over the reflector and the at least one electrode, etching at least one cavity into the etchable material, depositing a set of layers comprising a heterojunction into the at least one cavity to create at least one unit reaction cell, and removing the etchable material.

In one embodiment, the etchable material comprises polyimide. In one embodiment, the reflector is a distributed Bragg reflector, and the step of depositing the distributed Bragg reflector comprises depositing alternating layers of two different materials. In one embodiment, the two different materials comprise $SiN_x$ and $SiO_2$. In one embodiment, the at least one cavity is circular. In one embodiment, the at least one cavity comprises an array of regularly-spaced cavities. In one embodiment, the heterojunction comprises fullerene.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION

Figure 1A:
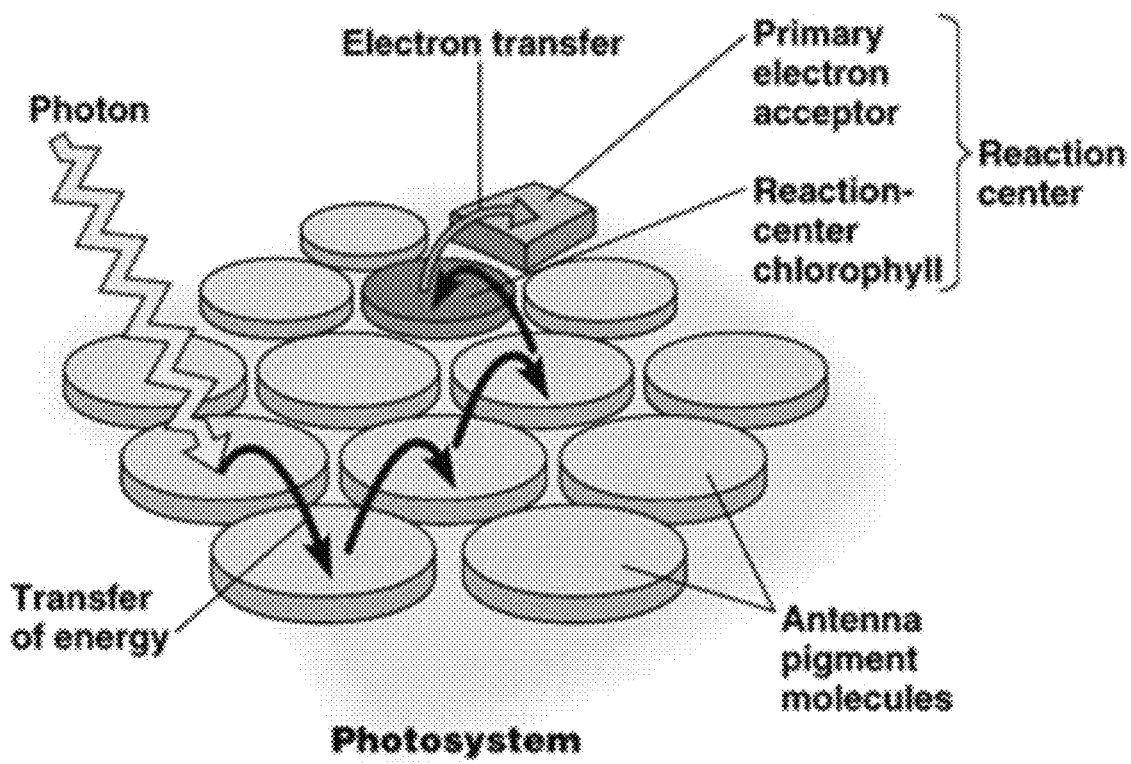
FIG. 1A shows a diagram of a natural photosynthetic system.
Figure 1B:
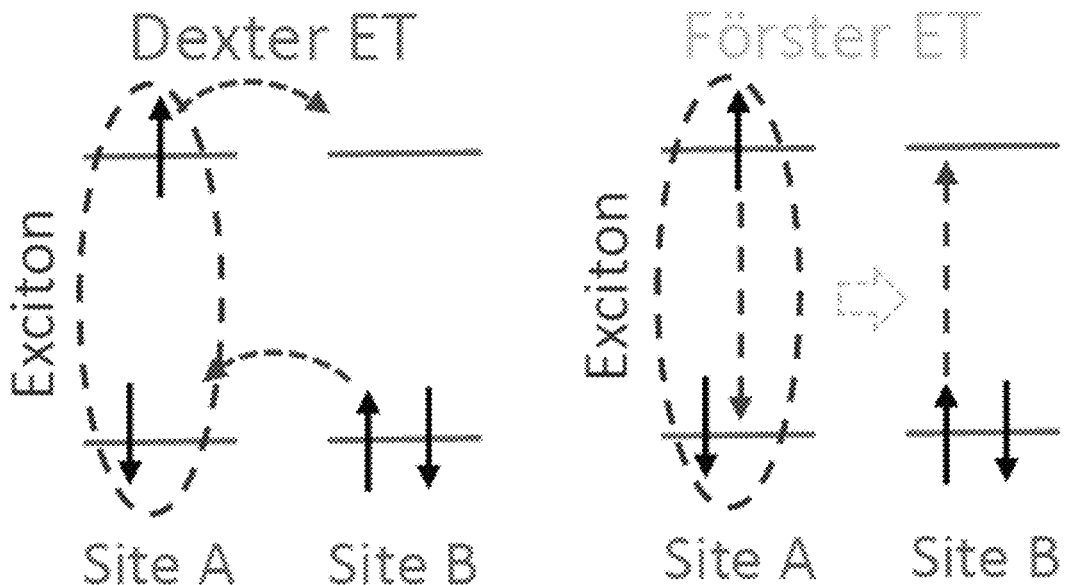
FIG. 1B shows two exciton transfer diagrams.
Figure 2A:
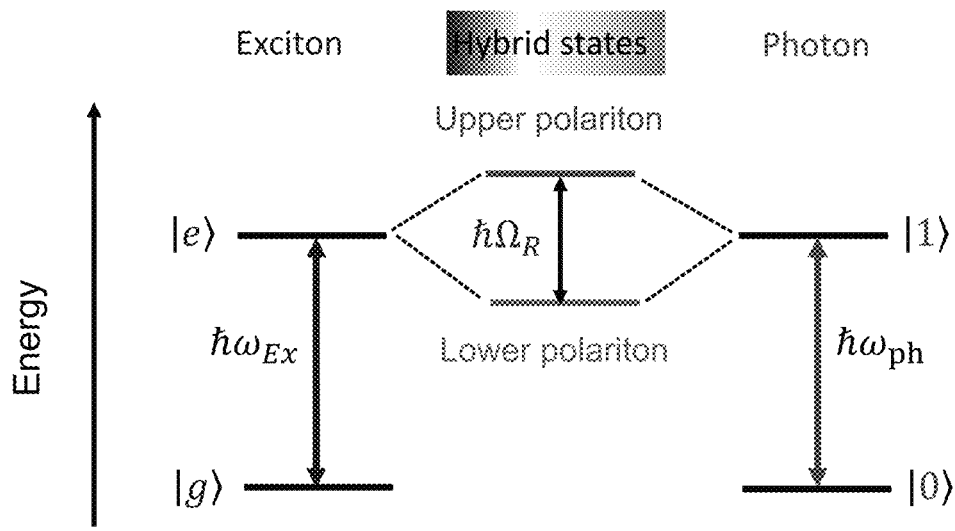
FIG. 2A shows a diagram of strong coupling between a molecular excitonic transition with an electromagnetic mode.
Figure 2B:
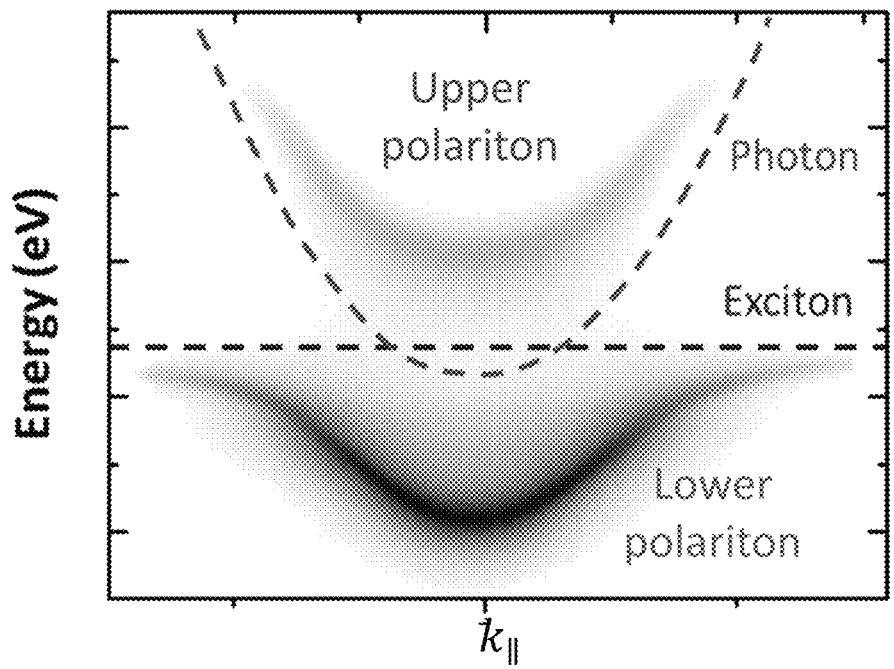
FIG. 2B is a graph of a characteristic anti-crossing energy-moment dispersion relation.

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

As used herein, the terms "electrode" and "contact" may refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to an electrode that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent.

As used herein, the term "semi-transparent" may refer to an electrode that permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" ($E_g$) of a polymer may refer to the energy difference between the HOMO and the LUMO. The band gap is typically reported in electron-volts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state ($S_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, power conversion efficiency ($\eta_p$) may be expressed as:

$$\eta_p = \frac{V_{OC} * FF * J_{SC}}{P_O}$$

wherein $V_{OC}$ is the open circuit voltage, FF is the fill factor, $J_{SC}$ is the short circuit current, and $P_O$ is the input optical power.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Although certain embodiments of the disclosure are discussed in relation to one particular device or type of device (for example OPVs) it is understood that the disclosed improvements may be equally applied to other devices, including but not limited to OLEDs, PLEDs, charge-coupled devices (CCDs), photosensors, or the like.

Although exemplary embodiments described herein may be presented as methods for producing particular circuits or devices, for example OPVs, it is understood that the materials and structures described herein may have applications in devices other than OPVs. For example, other optoelectronic devices such as OLEDs and organic photodetectors may employ the materials and structures. More generally, organic devices, such as organic transistors, or other organic electronic circuits or components, may employ the materials and structures.

In some embodiments, the optoelectronic device has one or more characteristics selected from the group consisting of being flexible, being rollable, being foldable, being stretchable, and being curved. In some embodiments, the optoelectronic device is transparent or semi-transparent. In some embodiments, the optoelectronic device further comprises a layer comprising carbon nanotubes.

Organic Photovoltaic Cells

As disclosed herein, the various systems and methods disclosed herein may be provided within a single-junction solar cell or a tandem or multi junction solar cell.

Figure 4A:
FIG. 4A shows an exemplary single-junction organic photovoltaic device.

FIG. 4A depicts an example of various layers of a single-junction solar cell or organic photovoltaic cell (OPV) 100. The OPV cell may include two electrodes having an anode 102 and a cathode 104 in superposed relation, at least one donor composition, and at least one acceptor composition, wherein the donor-acceptor material or active layer 106 is positioned between the two electrodes 102, 104. In some embodiments, at least one intermediate layer 108 may be positioned between the anode 102 and the active layer 106. Additionally, or alternatively, at least one intermediate layer 110 may be positioned between the active layer 106 and cathode 104.

The anode 102 may include a conducting oxide, thin metal layer, or conducting polymer. In some examples, the anode 102 includes a (e.g., transparent) conductive metal oxide such as indium tin oxide (ITO), tin oxide (TO), gallium indium tin oxide (GITO), zinc oxide (ZO), or zinc indium tin oxide (ZITO). In other examples, the anode 102 includes a thin metal layer, wherein the metal is selected from the group consisting of Ag, Au, Pd, Pt, Ti, V, Zn, Sn, Al, Co, Ni, Cu, Cr, or combinations thereof. In yet other examples, the anode 102 includes a (e.g., transparent) conductive polymer such as polyanaline (PANI), or 3,4-polyethyl-enedioxythiophene:polystyrenesulfonate (PEDOT:PSS).

The thickness of the anode 102 may be 0.1-100 nm, 1-10 nm, 0.1-10 nm, or 10-100 nm.

The cathode 104 may be a conducting oxide, thin metal layer, or conducting polymer similar or different from the materials discussed above for the anode 102. In certain examples, the cathode 104 may include a metal or metal alloy. The cathode 104 may include Ca, Al, Mg, Ti, W, Ag, Au, or another appropriate metal, or an alloy thereof.

The thickness of the cathode 104 may be 0.1-100 nm, 1-10 nm, 0.1-10 nm, or 10-100 nm.

As noted above, the OPV may include one or more intermediate layers, for example charge collecting/transporting intermediate layers positioned between an electrode 102, 104 and the active region or layer 106. The intermediate layer 108, 110 may be a metal oxide. In certain examples, the intermediate layer 108, 110 includes $MoO_3$, $V_2O_5$, ZnO, or $TiO_2$. In some examples, the first intermediate layer 108 has a similar composition as the second intermediate layer 110. In other examples, the first and second intermediate layers 108, 110 have different compositions.

The thickness of each intermediate layer may be 0.1-100 nm, 1-10 nm, 0.1-10 nm, or 10-100 nm.

The active region or layer 106 positioned between the electrodes 102, 104 includes a composition or molecule having an acceptor and a donor. In some embodiments, the composition may be arranged as an acceptor-donor-acceptor (A-D-A).

Figure 4B:
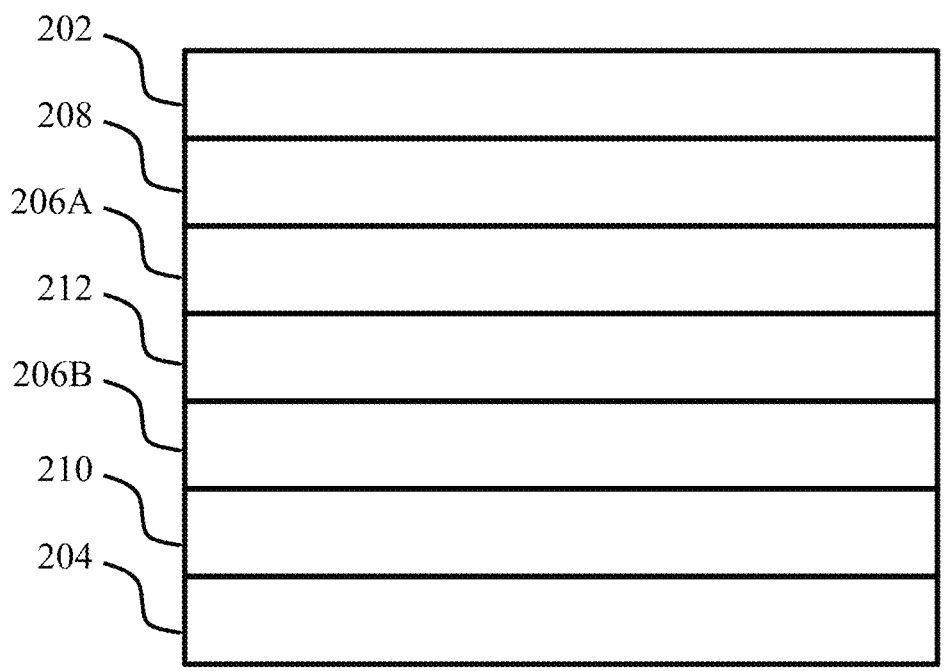
FIG. 4B shows an exemplary multi junction organic photovoltaic device.

FIG. 4B depicts an example of various layers of a tandem or multi junction solar cell or organic photovoltaic cell (OPV) 200. The OPV cell may include two electrodes having an anode 202 and a cathode 204 in superposed relation, at least one donor composition, and at least one acceptor composition positioned within a plurality of active layers or regions 206A, 206B between the two electrodes 202, 204. While only two active layers or regions 206A, 206B are depicted in FIG. 4B, additional active layers or regions are also possible.

At least one intermediate layer 208 may be positioned between the anode 202 and a first active layer 206A. Additionally, or alternatively, at least one intermediate layer 210 may be positioned between the second active layer 206B and cathode 204.

At least one intermediate layer 212 may be positioned between the first active layer 206A and the second active layer 206B.

The compositions, thicknesses, etc. of each layer may be the same as those discussed with reference to FIG. 4A.

The active region or layer 106, 206A, 206B positioned between the electrodes includes a composition or molecule having an acceptor and a donor. The composition may be arranged as an acceptor-donor-acceptor (A-D-A).

Disclosed herein is an artificial photosynthetic device using polariton antennas and a photodetector reaction center. Excitonic materials, such as tetraphenyldibenzoperiflanthene (DBP), is in some embodiments strongly coupled with one or more photonic structures, such as one-sided distributed Bragg mirrors. The formed polaritons, immune from exciton localization common to synthetic molecular solids, can transport energy across long distances on the disclosed antennas after absorbing light. To enhance the light injection into the polariton antenna, optical in-couplers, such as gratings, can be used. The transported polaritons are coupled into a photodetecting reaction center in the form of photoconductors or photodiodes, to be separated into electron-hole pairs. Simple integrated optical mode-converting structures are also disclosed to improve the coupling between antenna and reaction centers.

Some embodiments of the disclosed devices use organic polaritons due to strong coupling of organic excitons with high-quality Bloch surface waves to realize long distance (in some embodiments, one hundred-micrometer scale) photodetection at room temperature. The disclosed architecture represents a polariton-mediated long-range optoelectronic device application. Due to the coherence and delocalization nature of polaritons, the disclosed devices and methods may be used to simulate photosynthetic processes under ambient conditions with patterned reaction arrays, leading to room-temperature integrated organic photonic and optoelectronic devices with efficient long-range energy transfer and harvesting.

Figure 5A:
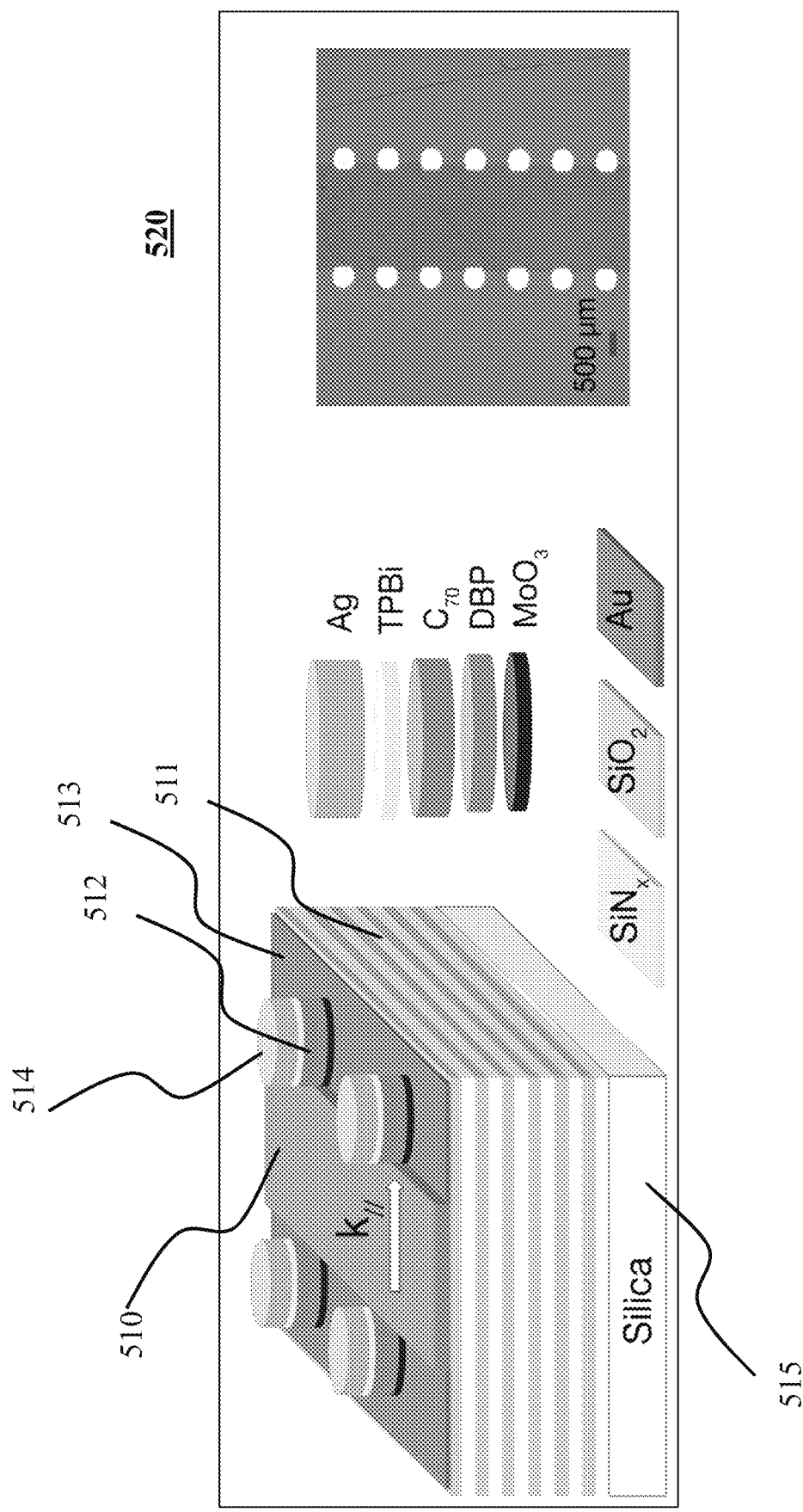
FIG. 5A is a schematic diagram of an exemplary photovoltaic device and a photograph of an exemplary photovoltaic device.

One embodiment of a device structure as disclosed herein is shown in FIG. 5A. The device may in some embodiments include a substrate 515 over which a reflector, for example a DBR 511 is positioned. Exemplary reflectors may be metallic or non-metallic. In one embodiment, a reflector 511 may comprise one or more pairs of sublayers comprising different materials, for example $SiN_x$ and $SiO_2$. In some embodiments, a DBR 511 may comprise one pair, two pairs, three pairs, four pairs, five pairs, six pairs, seven pairs, eight pairs, nine pairs, or ten pairs of sublayers. Each sublayer may have a thickness of 20 nm to 300 nm, or 30 nm to 250 nm, or 40 nm to 220 nm, or 60 nm to 200 nm, or 100 nm to 150 nm, or 100 nm to 120 nm, or 130 nm to 150 nm, or about 110 nm or about 140 nm.

The device may further comprise a lower electrode 513 positioned over at least a portion of the DBR. In some embodiments the lower electrode 513 may be an anode, which may comprise Au or any other suitable electrode material as contemplated herein. In some embodiments, the lower electrode 513 may be less than 50 nm thick, less than 40 nm, thick, less than 30 nm thick, less than 20 nm thick, or about 10 nm thick.

The device may further comprise a polariton antenna layer 510, which in the depicted embodiment is a film of DBP. The polariton antenna as shown is configured to cover a portion of a surface of the reflector and be in electrical contact with one or more unit reaction cells.

The one or more unit reaction cells may be positioned over a portion of the lower electrode 513, the unit reaction cells comprising a plurality of layers, including at least a heterojunction 512 and a top electrode 514, which may in some embodiments be a cathode, for example a silver cathode. In some embodiments the unit reaction cell may comprise a layer of $MoO_3$ for example as a hole transport layer, a layer of DBP for example as a donor material, a layer of an acceptor, for example fullerene, which may be fullerene $C_{70}$, and an electron transport layer, for example TPBi. The donor and acceptor materials may in some embodiments each have a thickness of less than 50 nm, less than 40 nm, less than 30 nm, less than 20 nm, or less than 10 nm.

In various embodiments, one or more unit reaction cells may be arranged in an array on a surface of the device, for example at regular or irregular intervals. In some embodiments, one or more unit reaction cells may be arranged at regular intervals having a space between adjacent unit reaction cells in the array of between 10 µm and 10 mm, or between 20 µm and 8 mm, or between 30 µm and 5 mm, or between 50 µm and 5 mm, or between 100 µm and 1 mm, or between 200 µm and 1 mm, or between 400 µm and 600 µm, or about 500 µm. In some embodiments, unit reaction cells may be positioned on a surface in a random distribution, wherein a distance between any individual unit reaction cell and the nearest unit reaction cell is at least 50 µm, at least 100 µm, at least 200 µm, at least 300 µm, at least 500 µm, at least 800 µm, at least 1 mm, at least 2 mm, at least 3 mm, at least 4 mm, at least 5 mm, at least 10 mm, or at least 20 mm.

Although DBP is used as the polariton antenna layer material in the depicted embodiment, it is understood that in other embodiments any other suitable material may be used, advantageously a polariton antenna layer may comprise a donor material for use in a heterojunction of the surrounding unit reaction cell.

With reference to image 520 in FIG. 5A, a photograph of a top view of an exemplary device is shown according to the diagram, demonstrating one exemplary layout of a device including the relative scale of the unit reaction cells and the film. In the depicted embodiment, the diameter of each unit reaction cell is about 500 µm. In various embodiments, the unit reaction cell may have a diameter of less than 5 mm, less than 4 mm, less than 3 mm, less than 2 mm, less than 1 mm, less than 700 µm, less than 600 µm, or less than 500 µm. Unit reaction cells may have any shape, not limited to circular as shown in image 520, for example ovular, square, triangular, hexagonal, octagonal, rectangular, trapezoidal, or any other polygonal or curved shape.

Figure 5B:
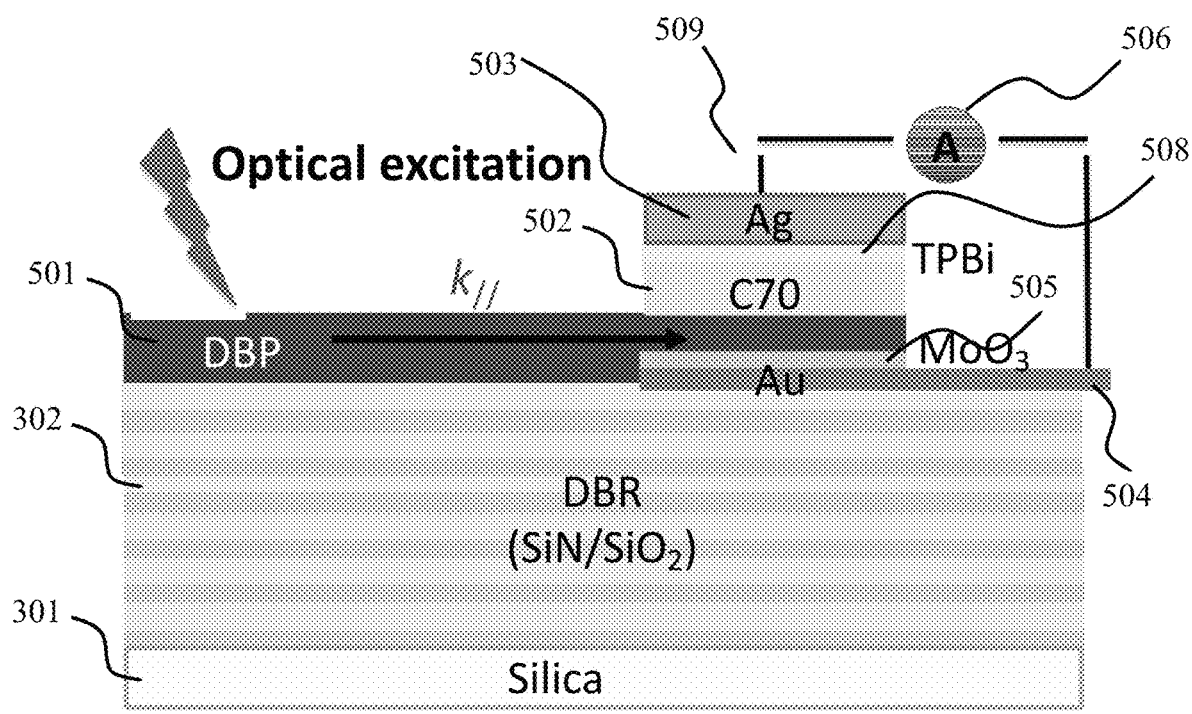
FIG. 5B is a cross-sectional diagram of an exemplary photovoltaic device.

A cross-sectional view of an exemplary device is shown in FIG. 5B. With reference to FIG. 5B, the substrate 301 is shown comprising Silica, with a DBR 302 disposed over the substrate, in the depicted embodiment comprising alternating layers of $SiO_2$ and $SiN_x$. As shown in the depicted embodiment, the DBP polariton antenna 501 has a first portion directly over the DBR, and a second portion within the unit reaction cell 509, positioned between the acceptor 502 and a thin layer of a charge transport material 505, for example a hole transport material which in some embodiments is $MoO_3$. In the depicted embodiment, the DBP serves both as the polariton antenna and the donor material for the heterojunction. The polariton antenna 501 converts photons received along the exposed surface into polaritons, and channels those polaritons into the unit reaction cell and into the heterojunction where they are converted into electrical current running between the two electrodes 503, 504. In one embodiment electrode 504 is an anode and electrode 503 is a cathode. In one embodiment, the unit reaction cell 509 further comprises a second charge transport layer 508 positioned between the top electrode and the acceptor layer, which may in some embodiments be an electron transport layer, which in the depicted embodiment comprises TPBi.

Combination with Other Materials

The materials described herein as useful for a particular layer in an organic optoelectronic device may be used in combination with a wide variety of other materials present in the device. The materials described or referred to below are non-limiting examples of materials that may be useful in combination with the compounds disclosed herein, and one of skill in the art can readily consult the literature to identify other materials that may be useful in combination.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Figure 6:
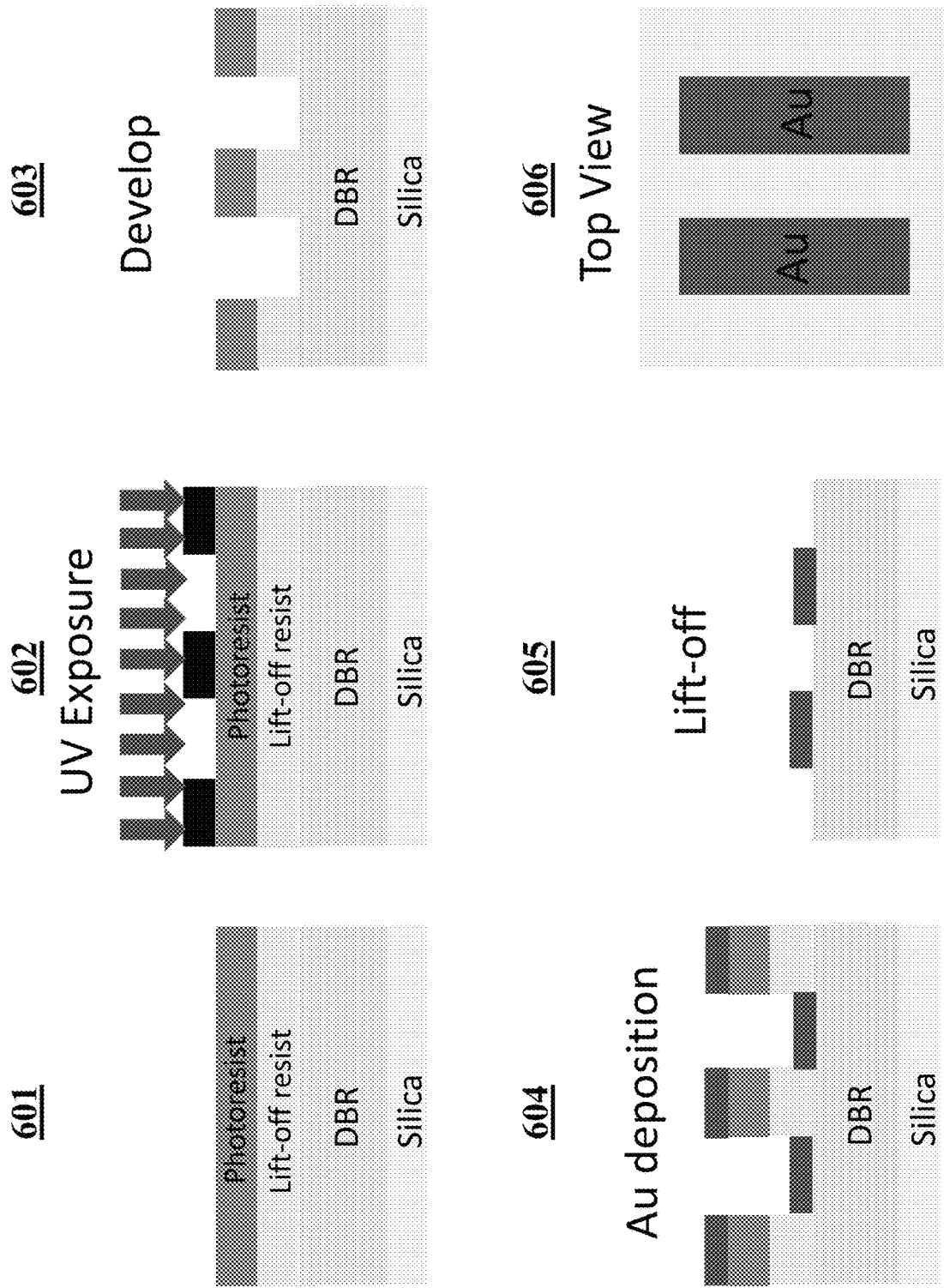
FIG. 6 is a partial diagram of a fabrication method of the disclosure.
Figure 7:
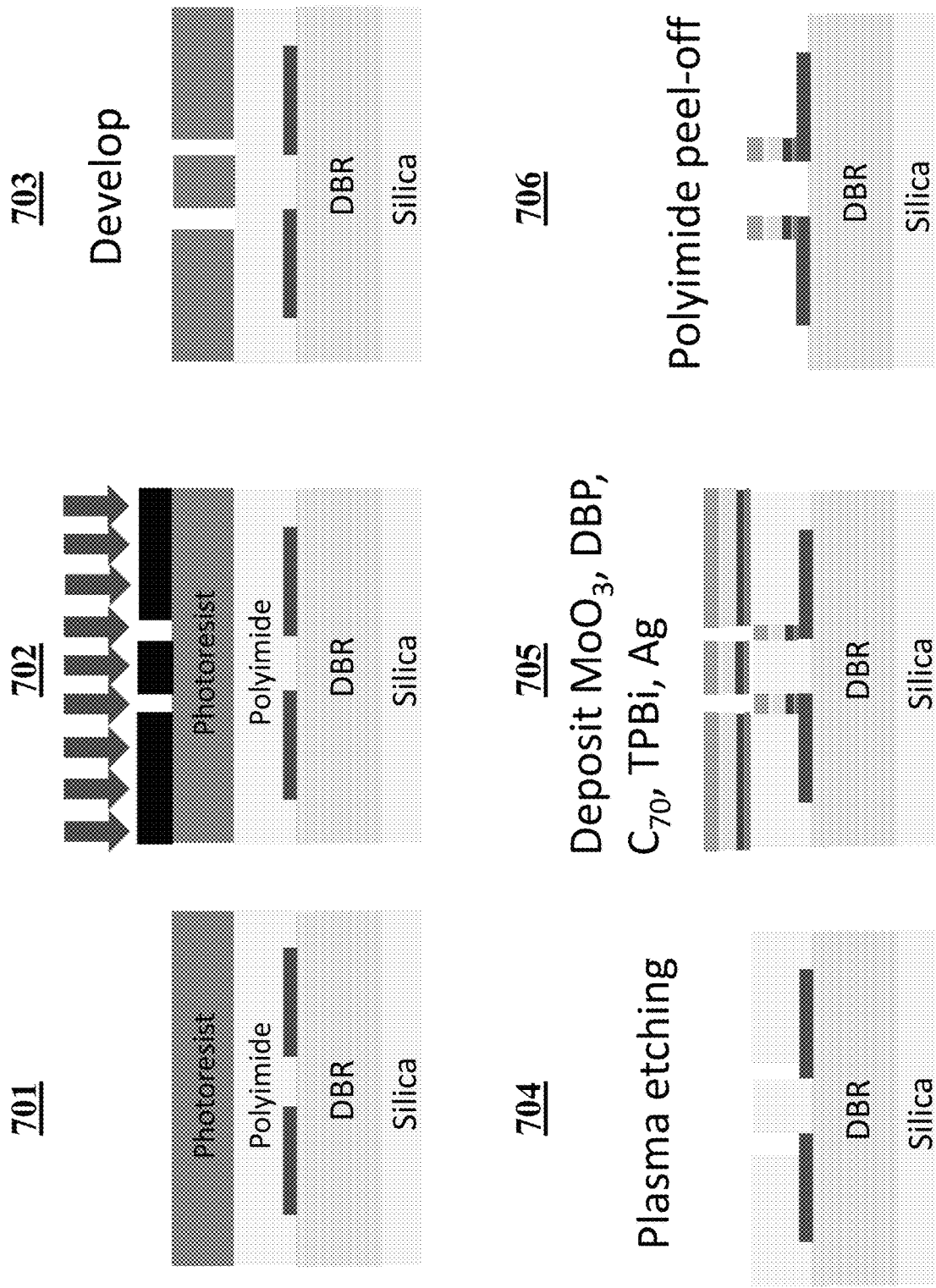
FIG. 7 is a partial diagram of a fabrication method of the disclosure.

In one aspect, a method of fabricating an organic optoelectronic device is disclosed, as shown in FIG. 6 and FIG. 7. With reference to FIG. 6, first, a DBR is grown on a silica substrate by Plasma Enhanced Chemical Vapor Deposition (PECVD). Photolithography and electron beam evaporation are then used to make two electrode pads on the top of DBR. In a first step 601, a substrate and DBR are layered with a lift-off resist material and a photoresist material. A mask is then positioned over the photoresist material in step 602, and UV or other light is then applied to remove the unmasked parts of the photoresist and lift-off resist in step 603. Material for the electrodes is then deposited in step 604, in the depicted embodiment the material is gold, for example for an anode. The excess lift-off resist and photoresist materials are removed in step 605, to reveal one or more patterned electrodes over a region of the DBR. A top view is shown in 606.

With reference to FIG. 7, photolithography and plasma etching are first used to make some patterns, all the materials (e.g. $MoO_3$, DBP, $C_{70}$, TPBi, Ag) for the unit reaction cell are then deposited. Finally, the polyimide is peeled off, and the device structure is left. A polyimide material and photoresist is first deposited over the DBR and first electrodes in step 701. A mask is then positioned over the photoresist and UV or other light is then applied to remove the unmasked parts of the photoresist in steps 702 and 703. Portions of the polyimide are removed via plasma etching in step 704, and the materials for the unit reaction cells are then deposited in sequence in step 705. Finally, the excess polyimide is peeled off in step 706, leaving behind the unit reaction cells positioned over the electrodes and the DBR.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure.

Example 1

Disclosed herein, long-range polariton-mediated photodetection is shown in the organic exciton-BSW strongly coupled system at room temperature, resulting from long-distance (>100 μm) polariton propagation. The present disclosure is the first optoelectronic device that relies on polariton-to-exciton conversion with long-range propagation and detection of excited states in semiconductors. An exemplary device structure is shown in FIG. 5A.

Figure 8A:
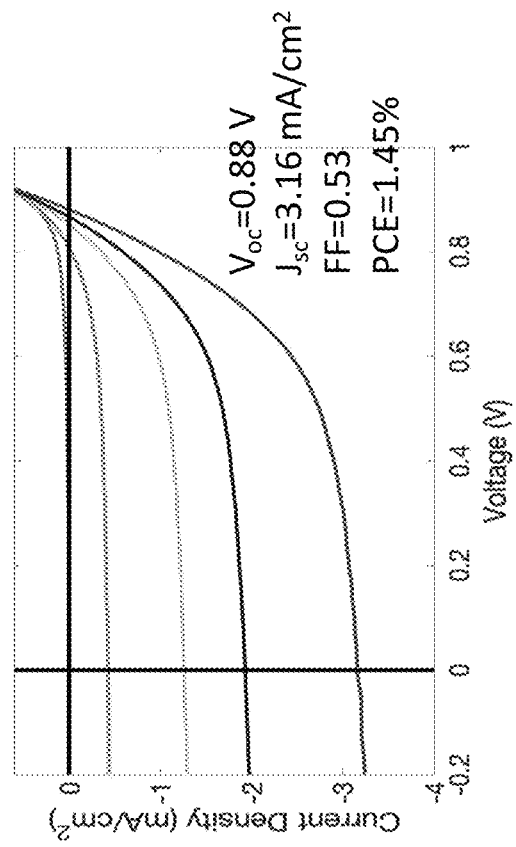
FIG. 8A and FIG. 8B are graphs of experimental data.
Figure 8B:
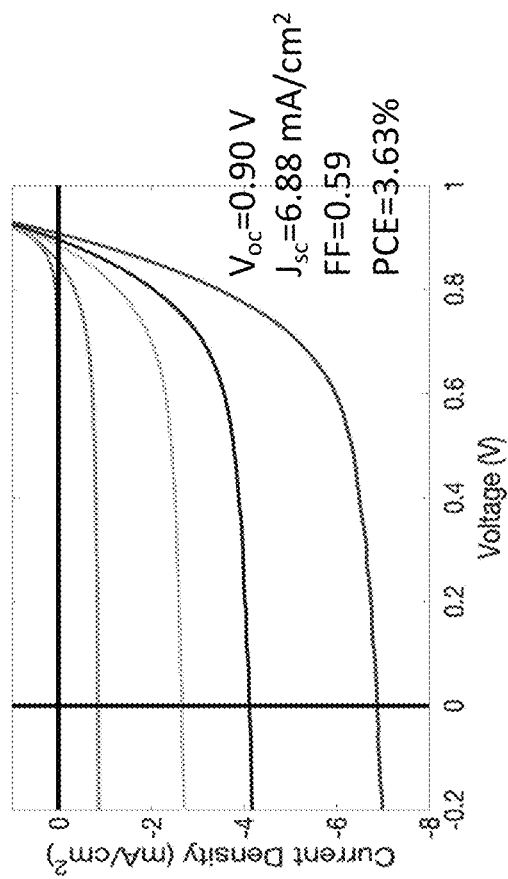

In one embodiment, a device of 5A includes a molecular thin film of tetraphenyldibenzoperiflanthene (DBP) 510, a model organic electronic molecule, on the surface of a DBR 511 that serves as the light gathering antenna, which is edge-coupled into a bilayer donor-acceptor (DBP/$C_{70}$) heterojunction 512 acting as a unit reaction cell that harvests the excitation energy by dissociation into an electron and hole that are collected at the bottom Au anode 513 and the top Ag cathode 514. The DBR 511 is grown in some embodiments by Plasma Enhanced Chemical Vapor Deposition (PECVD), and the unit reaction cells may be fabricated using photolithography and polyimide-based peel-off patterning with vacuum thermal evaporation. Image 520 in FIG. 5A shows a microscopic image of the device with several unit reaction cells. Similar device structures without a DBR were fabricated and used as controls, which have no exciton polaritons. In one experiment, standard bilayer DBP/$C_{70}$ organic photovoltaic devices with ITO and Au electrodes were fabricated in order to confirm the power conversion performance. The results of the ITO device are shown in FIG. 8A, and the results of the Au device are shown in FIG. 8B.

The transverse-electric (TE) angular white light reflectivity spectra of the device area was measured where only DBP deposits on DBR (see diagram 901, FIG. 9), and the simulation results using transfer matrix formalism are shown on the left side of diagram 901. As the DBR supports a single TE Bloch surface wave above the total internal reflection (TIR) angle ($\theta_{TIR}=42°$), both measurement and simulation results show the narrow dispersive mode at $\theta>\theta_{TIR}$, which is the lower polariton (LP) branch that anti-crosses the DBP exciton vibronics (see right side of diagram 901, FIG. 9) characterizing exciton-BSW strong coupling. The upper polariton (UP) branch is barely visible as a faint curve in the wavelength range between 450 nm and 500 nm in the simulation results, which is unnoticeable in the measurement due to the intensity contrast limit. The room temperature TE-polarized angular PL emission spectra were measured for the same area (see graph 902, FIG. 9), and the significant PL signal followed LP dispersion, indicating the dominant radiative relaxation channel occurs through the LP. The extremely low PL response at low energies (long wavelength) and high momenta is attributed to short-propagating evanescent modes from the limit of the DBR optical band-gap (sideband modes).

Figure 10:
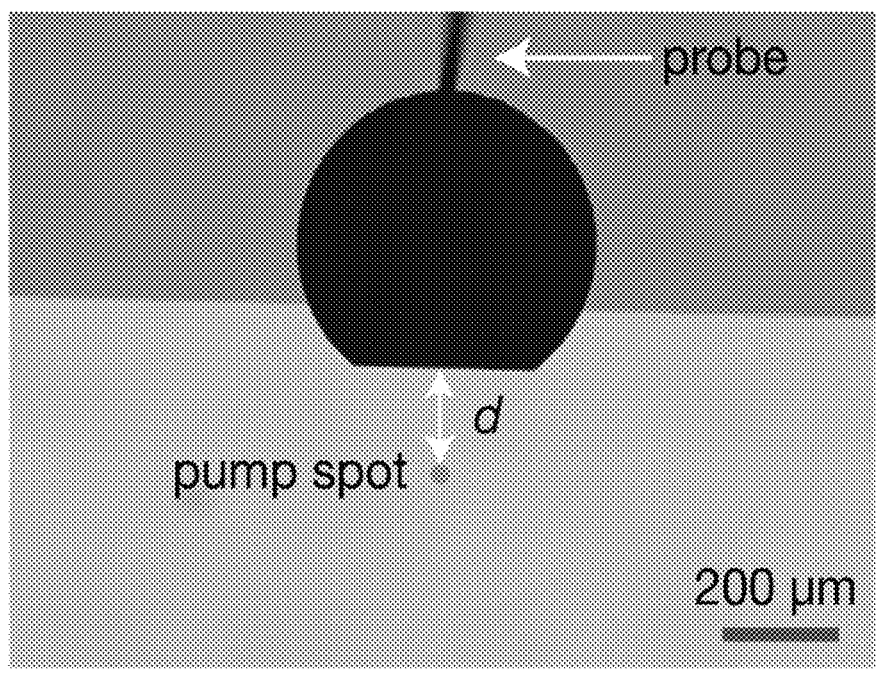
FIG. 10 is a diagram of an experimental setup.
Figure 11A:
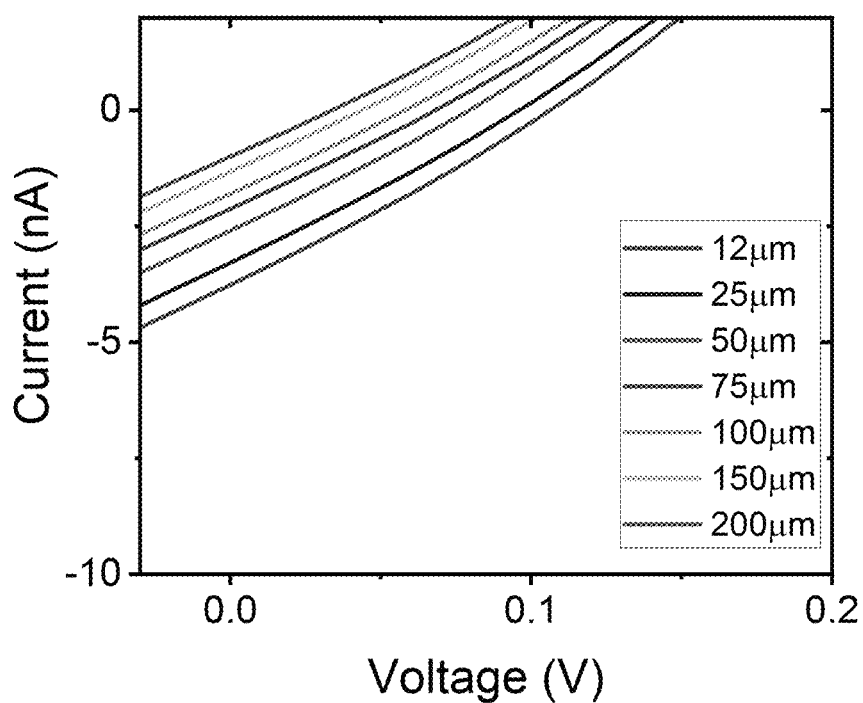
FIG. 11A, FIG. 11B, FIG. 11C, and FIG. 11D are graphs of photocurrent over voltage at various distances.
Figure 11B:
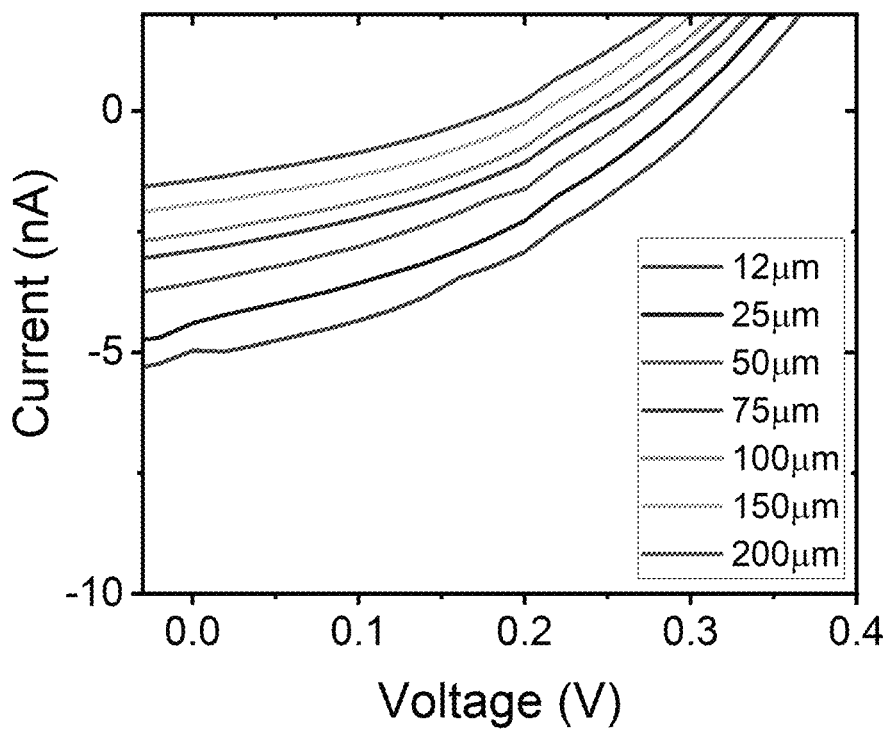

To investigate and assess the long-range photodetection of organic exciton polaritons in strongly coupled systems, photocurrent-voltage (I-V) characteristics were measured as a function of distance between a pump spot and a device unit reaction cell, and compared to that of control devices in the absence of exciton polaritons. A 532 nm-laser was used to pump a particular sample area which had a certain distance (d) away from the edge of the device unit reaction cell (FIG. 10). I-V curves were first recorded for two types of controls with no exciton-polaritons, as shown in FIG. 11A (unit reaction cells on quartz, no DBP in the pump area) and FIG. 11B (unit reaction cells on quartz, with DBP in the pump area). The I-V characteristics from the control had no significant dependence on the distance, while the results from the polariton device sample show that its I-V characteristics strongly depend on the distance with much larger short-circuit current ($I_{sc}$). In other words, the distance-dependent photodetection response was observed when the organic excitons strongly hybridize with the propagating BSW mode, where the long-range energy transport was mediated by organic exciton polaritons.

Figure 11C:
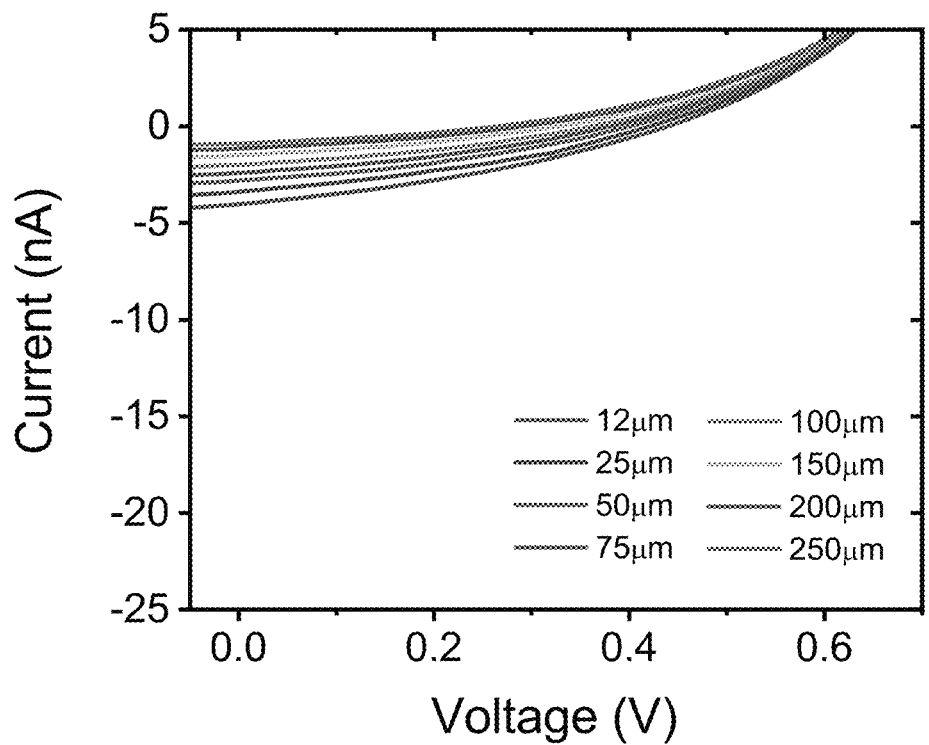
Figure 11D:
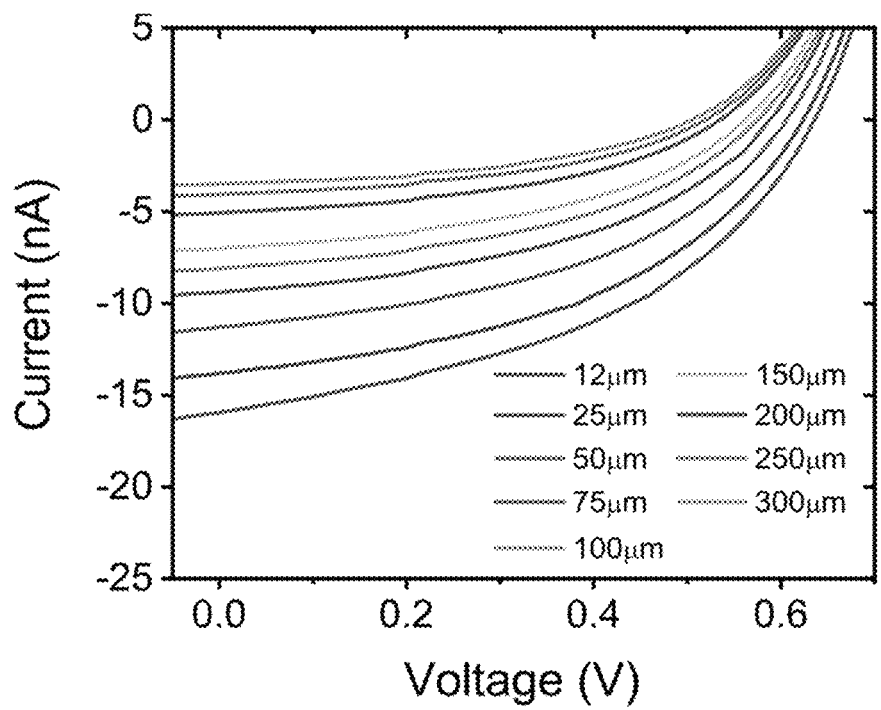

I-V curves were then recorded and shown for the control and polariton device sample in FIG. 11C and FIG. 11D, respectively. With reference to FIG. 10, a schematic of the distance-varying I-V measurements is shown for a single device unit reaction cell under a microscope with an Au-wire soft probe. Graph 11C shows I-V characteristics of the control device, positioned on quartz, under laser illumination for different distances, and graph 11D shows the I-V characteristics of the polariton device sample, positioned on a DBR, under laser illumination as a function of distance. As shown in FIGS. 11C and 11D, the I-V characteristics from the control has no significant dependence on the distance, while the results from the polariton device sample show that its I-V characteristics strongly depend on the distance with much larger short-circuit current ($I_{sc}$). In other words, the distance-dependent photodetection response is observed when the organic excitons strongly hybridize with the propagating BSW mode, where the long-range energy transport is mediated by organic exciton polaritons.

Figure 11E:
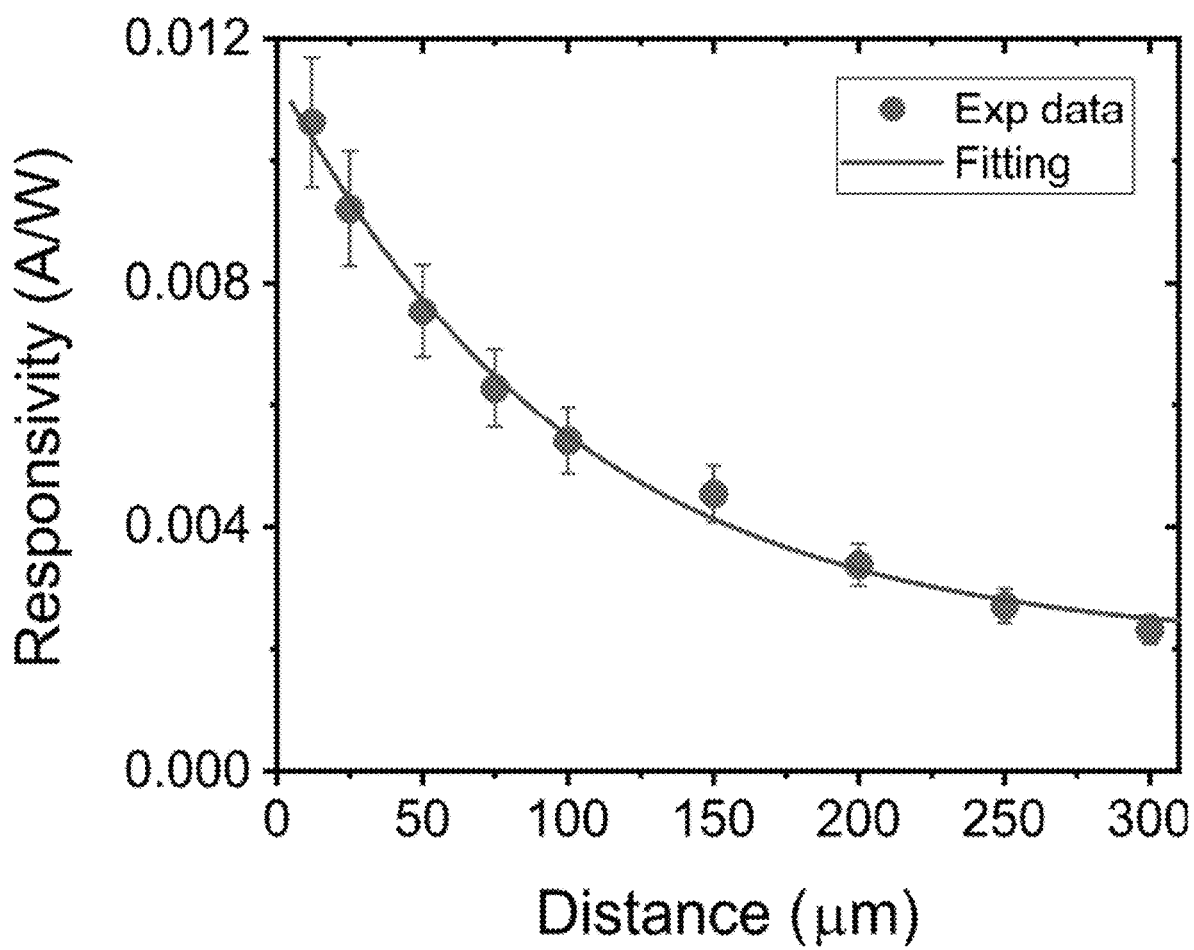
FIG. 11E is a graph of responsivity over distance.

As shown in FIG. 11E, the measured distance-dependent responsivity of the polariton device at V=0 is shown with a decay fitting and error bars. To evaluate the device performance of photodetection, the responsivity (R) at V=0, that is, the current generated per incident optical power ($P_{inc}$), $R=I_{sc}/P_{inc}$, where $I_{sc}$ is the short-circuit current, is shown as a function of distance in FIG. 11E, which follows an exponential decrease as the distance linearly increases. Here, a photodetection length is defined, which can be obtained by fitting the exponential decay constant of the responsivity with distance, yielding that which gives $d_{1/e}=105$ μm. This characteristic length is determined by the propagation distance of organic exciton polaritons in the strongly coupled system, $L_{1/e}$, which is obtained from the optical characterization results.

Figures 11F, 11G:
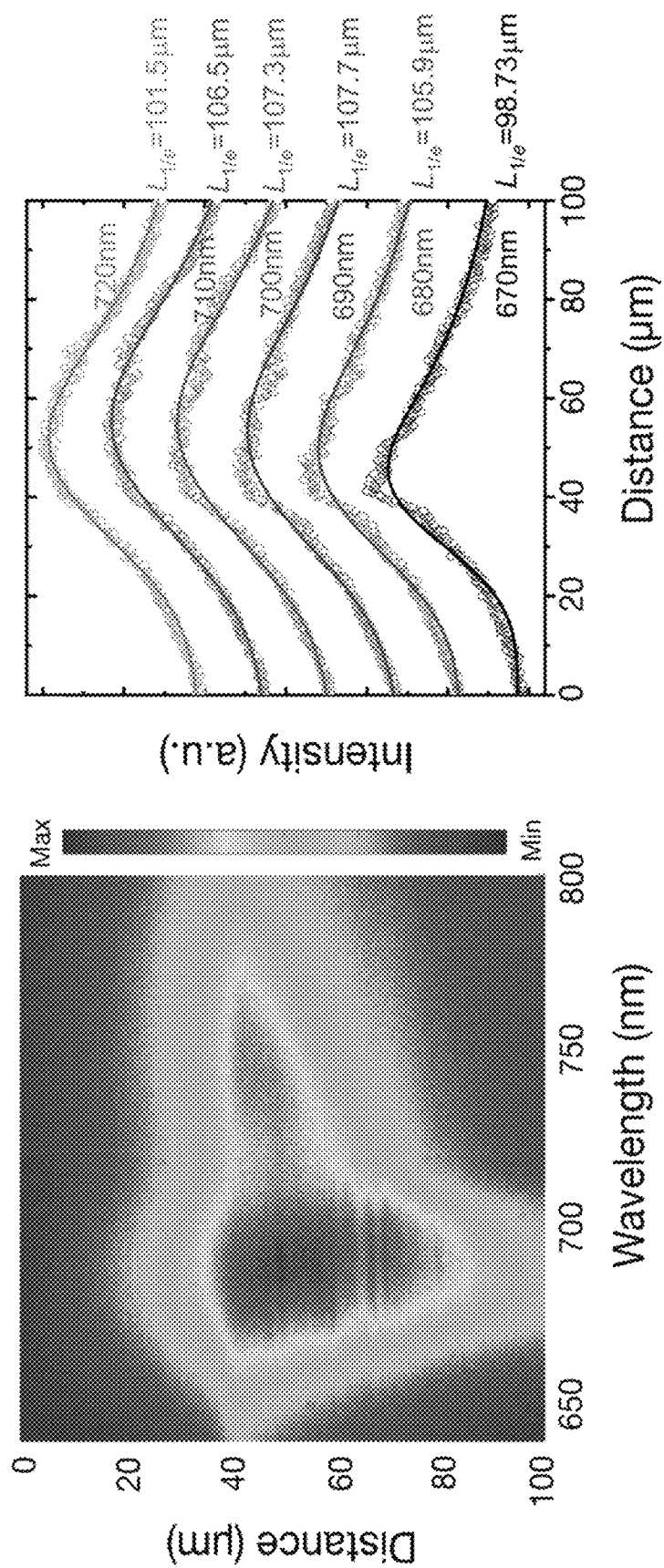
FIG. 11F is a graph of wavelength-resolved polariton PL emission profiles.
FIG. 11G is a graph of total propagation length for a set of wavelengths.

It is worth mentioning that the I-V response under illumination from the control is attributed to scattering from film defects and weak guided modes in the substrate. This can also be found from the results of the polariton sample, where the I-V characteristics under illumination had no pronounced change when the detection distance exceeded 100 μm, but never overlapped with the response under dark. To evaluate the device performance of photodetection, the responsivity $\mathcal{R}$ at V=0, that is the current generated per incident optical power ($P_{inc}$), $$\mathcal{R} = \frac{I_{SC}}{P_{inc}},$$

where $I_{sc}$ is the short-circuit current, is shown as a function of distance (FIG. 11E), which followed an exponential decrease as the distance linearly increased. Here, a photodetection length was defined, which was the exponential decay constant of the responsivity with distance, yielding that $d_{1/e}=105$ μm. This characteristic length was determined by the propagation distance of organic exciton polaritons in the strongly coupled system. To validate the relation between the photodetection length and polariton propagation length, the polariton propagation was investigated by measuring the wavelength-resolved polariton PL emission profiles (details below), as shown in FIG. 11F. Using the polariton self-interference model, the polariton propagation pattern was calculated and the total propagation length for the wavelength with significant PL emission signal was obtained, as shown in FIG. 11G, $L_{1/e}=100$ μm, which is in agreement with the characteristic photodetection length, $d_{1/e}$.

Figure 17A:
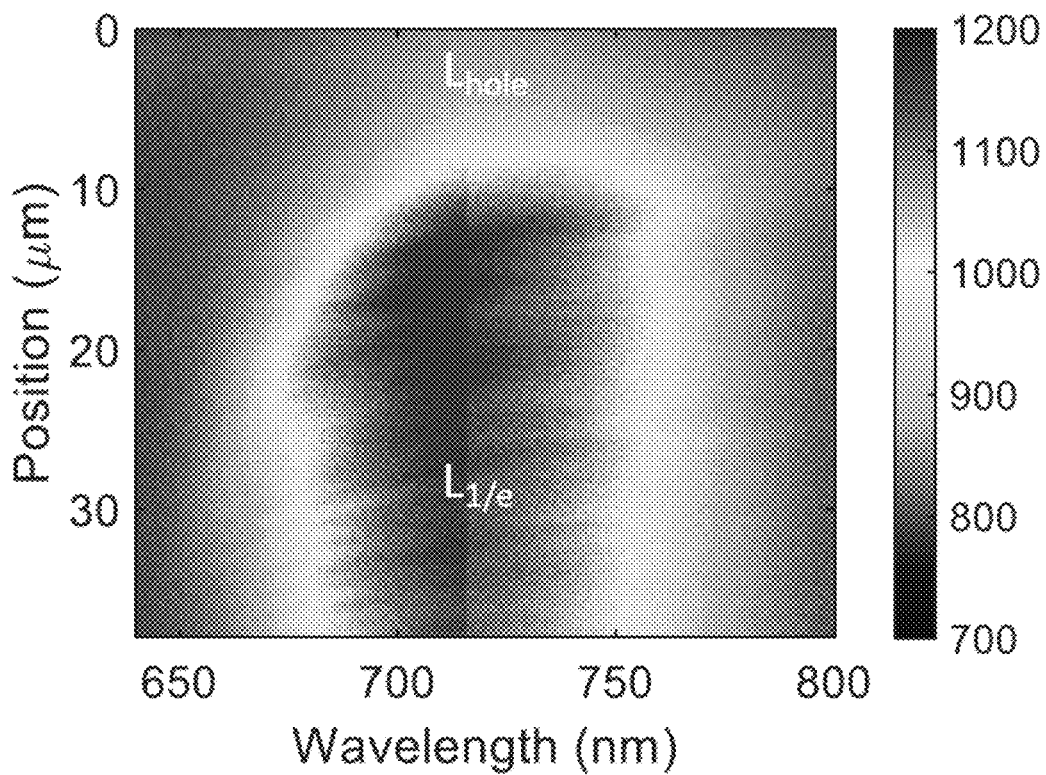
FIG. 17A is a graph of polariton propagation across a range of positions.
Figure 17B:
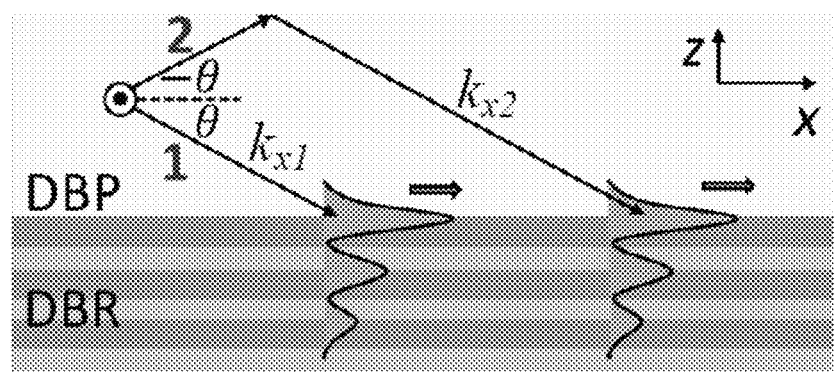
FIG. 17B is a diagram of a polariton self-interference model.

The polariton self-interference model is illustrated in FIG. 17B. More information about the polariton self-interference model is disclosed in Hou, S. et al. Ultralong-Range Energy Transport in a Disordered Organic Semiconductor at Room Temperature Via Coherent Exciton-Polariton Propagation. Adv. Mater. 32, 1-6 (2020), incorporated here in reference in its entirety.

With reference to FIG. 11F, a wavelength-resolved polariton propagation map is shown. With reference to FIG. 11G, six propagation profiles at wavelengths of 670, 680, 690, 700, 710, and 720 nm are shown. The calculated distributions (solid lines) are fit to the measured data (circles). The total polariton propagation length ($L_{1/e}$) for wavelengths with significant PL emission signals are longer than 100 μm.

In summary, an optoelectronic device that relies on polariton-to-exciton conversion for long range propagation and detection of excited states in semiconductors was demonstrated, which provides over one hundred-micrometer scale photodetection mediated by organic exciton-polaritons in a BSW-exciton strongly coupled system at room temperature, where polaritons provide an alternative path for the transport of excitation energy to a remote unit reaction cell with the reaction complex. This long-range optoelectronic response can be further improved by delicate structure configuration with high-quality BSW mode and efficient excitation coupling in the donor-acceptor heterojunction device unit reaction cell. Importantly, this result paves the way for simulating photosynthetic processes with patterned unit reaction cell arrays, which will lead to the realization of room-temperature integrated efficient organic photonic and optoelectronic devices with long-range energy transfer and harvesting.

Device Fabrication

DBRs comprising six pairs of $SiN_x$ (110 nm) and $SiO_2$ (140 nm) layer were grown on 180 μm thick fused silica substrates by Plasma Enhanced Chemical Vapor Deposition (PECVD). The Au anode (2 nm Ti+10 nm Au) was deposited onto the DBR substrates by e-beam evaporation in a vacuum chamber (base pressure ~$10^{-7}$ Torr unless otherwise noted) and patterned into two pads via photolithography. Micro 90® was diluted in 1:1 (v/v) de-ionized water and isopropanol at a total concentration of 5% and spin-coated on top of the ITO/glass substrate at 4000 rpm as a peel-off release agent layer. The polyimide (PI-2611) was spin-coated onto the patterned-Au coated DBR substrates at 5000 rpm followed by soft cure at 90° C. and 150° C. for 90 s each, and hard baked at 350° C. for 30 min, which results in a thickness of 3 μm. The PI was then photolithographically patterned and etched using $O_2$ plasma ($C_4F_8:O_2$:He=14:56:

50 sccm, 30 mTorr chamber pressure, 500 W transformer coupled plasma (TCP) power, 25 W bias power), providing a pattern with two columns of circles with the diameter of 500 µm, there was one column of circles on each Au pad.

The samples with the designed pattern were transferred into a high vacuum chamber for thermal evaporation of 10 nm thick $MoO_x$ at 0.2 Å/s, 20 nm thick DBP at 0.6 Å/s, 30 nm thick $C_{70}$ at 0.6 Å/s, 10 nm thick TPBi at 0.2 Å/s, and 100 nm thick Ag at 0.1-0.6 Å/s in vacuum as the top electrode. After Ag cathode deposition, the PI left on samples were peeled off.

Optical Characterization

The angular reflectivity and PL spectra were measured using a k-space microscope with a 1.40 NA, 100× objective (Olympus), a white lamp source (for reflectivity), a fiber-coupled continuous-wave laser diode at 532 nm with a laser line filter was used to excite the sample (for PL), a k-space lens, a TE polarizer, a λ=550 nm long pass filter (for PL), and a spectrometer (SpectraPro HRS-500) with a 1024×1024 CCD camera (PIX 1024B, Princeton Instruments). For PL measurements, a 2 µm diameter Gaussian laser beam was focused on the surface of the DBP layer with a 50× objective (NA=0.45), from the DBP side, and the emission was collected with a 100× objective (NA=1.40), from the substrate side. Before projecting it to the spectrometer or camera, delay lenses were used to reconstruct k-space and real-space images, where a slit filter in k-space was placed as designed.

Figure 9:
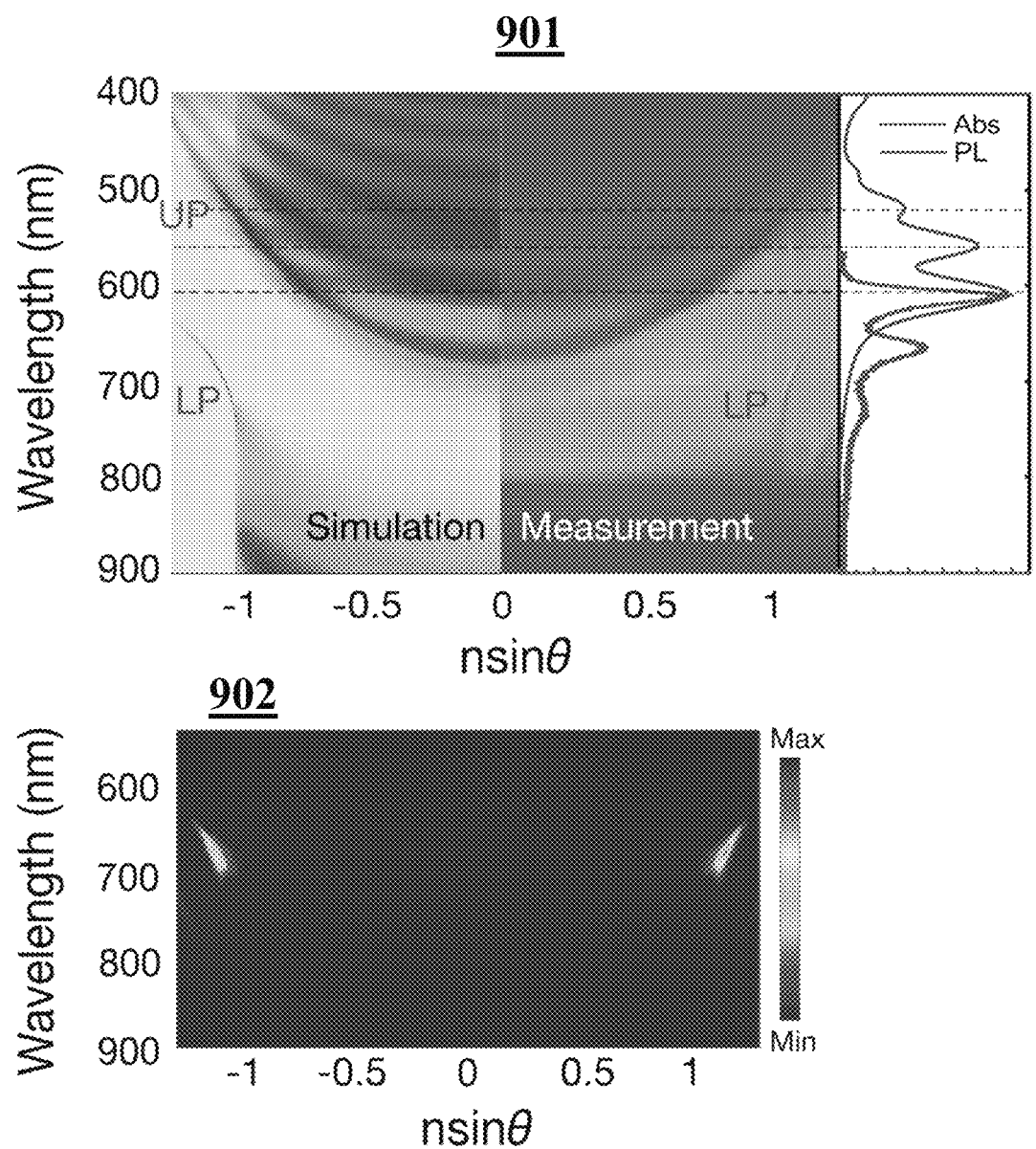
FIG. 9 is a graph of simulated and measured transverse electric angular reflectivity spectra of strongly coupled vibronic excitons of DBP and the BSW, and a measured transverse electric angular PL spectra of the strongly coupled system using a laser excitation wavelength.

With reference to FIG. 9, strong exciton-BSW coupling is demonstrated by measuring angular reflectivity and PL spectra, which exhibit anti-crossing dispersion. A simulated (901, left) and measured (901, middle) transverse electric angular reflectivity spectra of strongly coupled vibronic excitons of DBP (horizontal gray dashed-lines) and the BSW (black dashed-line) is shown. Absorption and PL spectra (901, right) of uncoupled DBP show the vibronic progressions. As shown in Image 902, measured transverse electric angular PL spectra of the strongly coupled system are shown using a laser excitation wavelength at 532 nm and a long-pass spectral filter with a cut-off wavelength of 550 nm.

Figure 12:
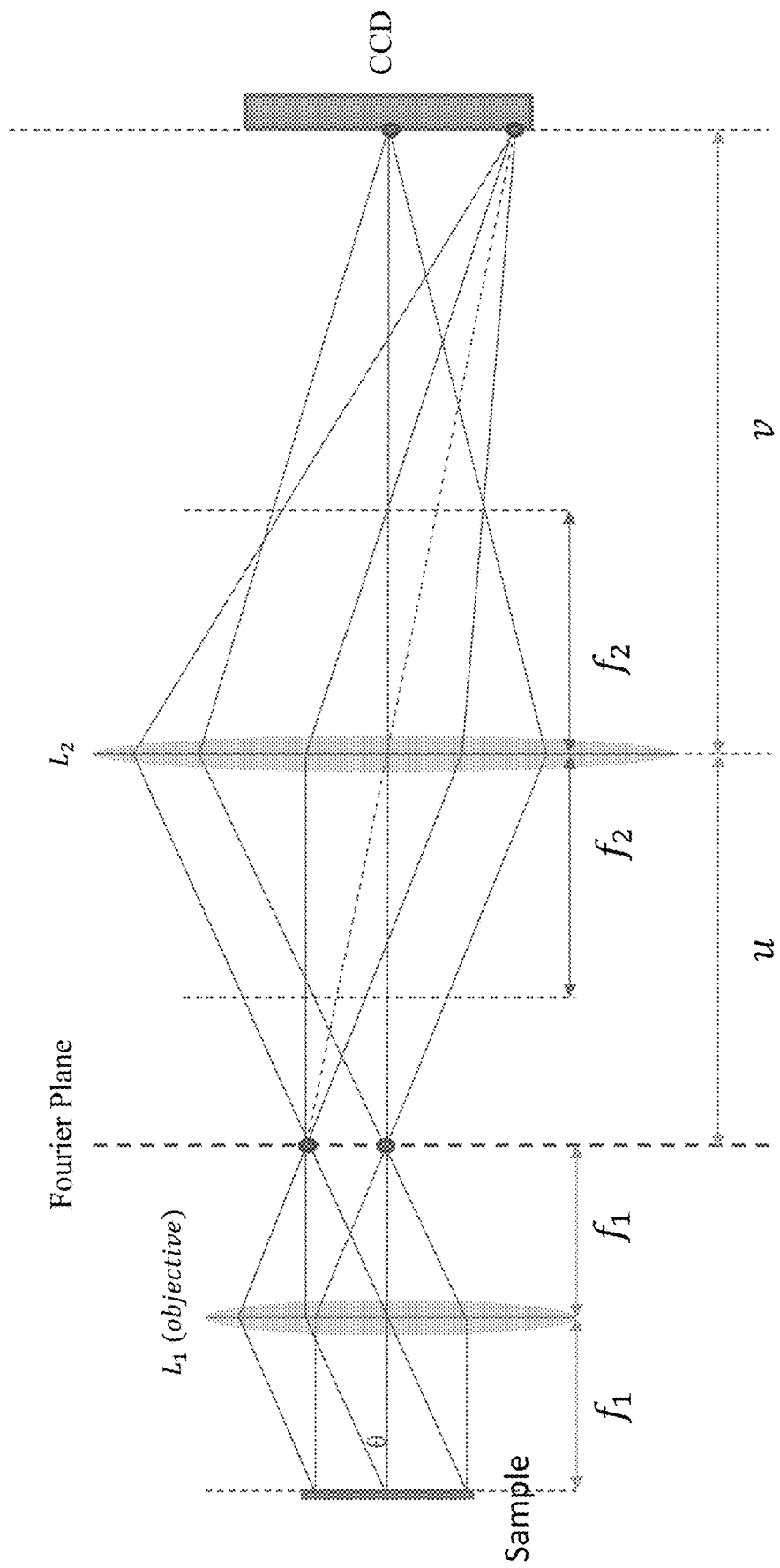
FIG. 12 is a diagram of a Fourier imaging apparatus.

A Fourier imaging methodology, as shown in FIG. 12, was used to generate the angle-resolved signal as shown in 902.

With reference to FIG. 11F, polariton propagation is measured by measuring the wavelength-resolved polariton PL emission profiles. Using the polariton self-interference model, the polariton propagation pattern is calculated and the total propagation length is obtained for the wavelength with significant PL emission signal, as shown FIG. 11G and listed in Table 1 below, $L_{1/e}$~100 µm.

TABLE 1

| Wavelength (nm) | 670 | 680 | 690 | 700 | 710 | 720 |
|---|---|---|---|---|---|---|
| $L_{1/e}$ (µm) | 98.7 ± 3.6 | 105.9 ± 3.6 | 107.7 ± 3.7 | 107.3 ± 3.2 | 106.5 ± 2.6 | 101.5 ± 2.4 |

Experiment 2

In the second disclosed experiment, room temperature polariton propagation was investigated in an all-dielectric photonic structure comprising a disordered molecular thin film of tetraphenyldibenzoperiflanthene (DBP), a model organic electronic molecule, deposited onto the surface of a distributed Bragg reflector (DBR). Similar to the surface confined and propagating modes of 1D or 2D photonic crystals, the truncated periodic multilayers of the DBR support a Bloch surface mode, of which its strong electric-field enhancement and low optical loss is ideal for strong coupling with excitons and long-range transport applications. Angular reflectivity measurements show two anti-crossing polariton branches with a giant vacuum Rabi splitting energy of 480 meV due to ultrastrong coupling between 0-0 vibronic of the molecular excitons and Bloch surface modes. Using spatial and momentum-resolved photoluminescence (PL) imaging measurements, polariton transport over distances of at least 100 µm is observed, and a halo-like intensity pattern due to polariton self-interference. The disclosed model of polariton transport indicates that the hole size is determined by the coherence length correlated to phase-breaking by inelastic scattering, while the total propagation distance depends on the attenuation coefficient that includes material absorption and other scattering processes.

Figures 13A, 13B:
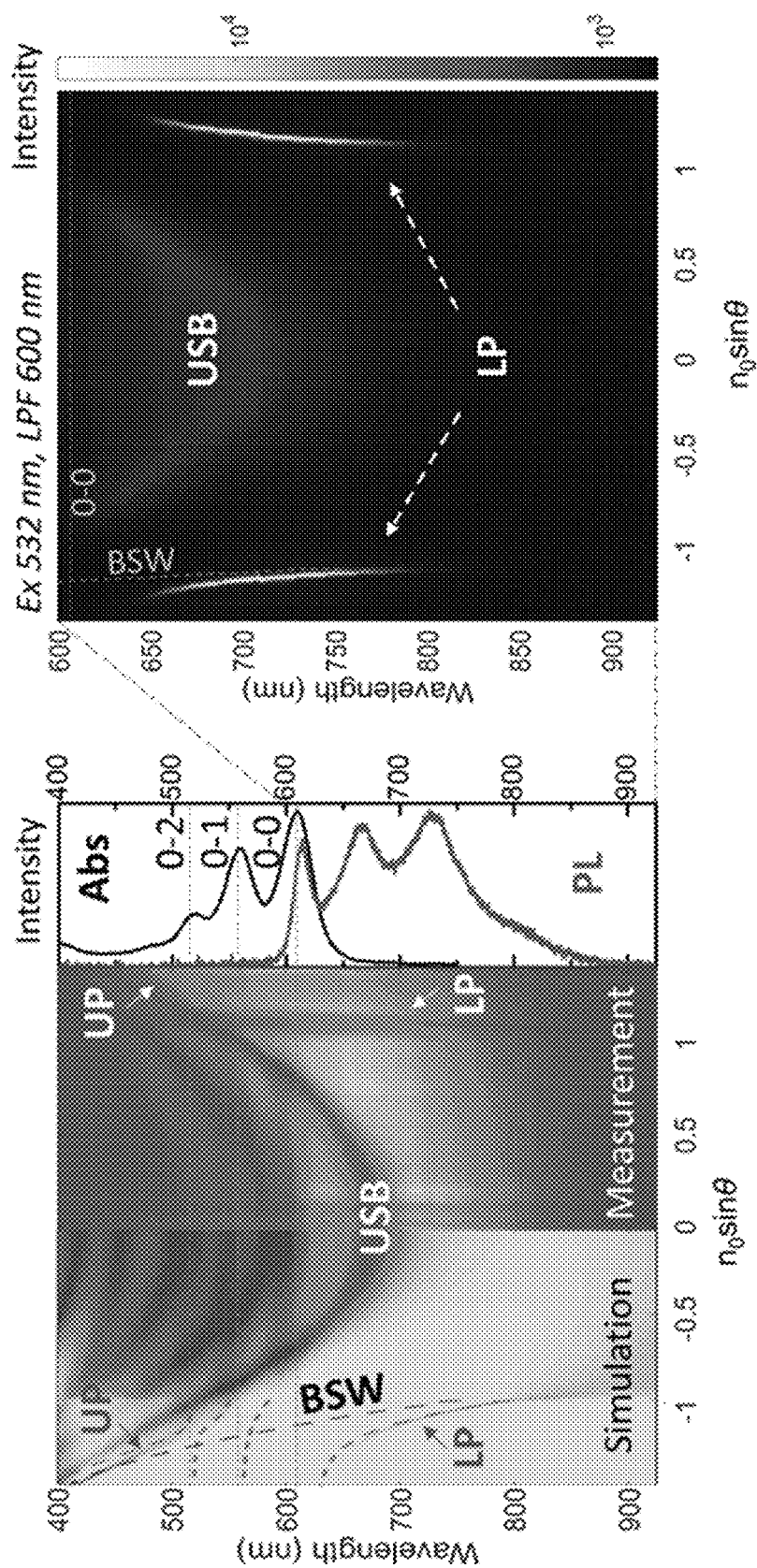
FIG. 13A shows simulated (left) and measured (middle) transverse electric angular reflectivity spectra of ultrastrong coupled vibronic excitons of DBP and the BSW.
FIG. 13B shows a measured transverse electric angular PL spectra of the ultrastrong coupled sample.

The sample consists of a DBR comprising four pairs of $ZnS/MgF_2$ followed by a 20 nm-thick DBP film on a fused silica substrate. The DBR supports a single transverse-electric (TE) Bloch surface wave (BSW) above the total internal reflection (TIR) angle ($\theta_{TIR}$=42°). The DBP film is amorphous with a low surface roughness. It exhibits three distinct vibronics (0-0, 0-1, 0-2) of its lowest spin-singlet exciton, corresponding to three absorption peaks (610, 560, and 520 nm) and Stokes-shifted emission peaks (615, 670, and 730 nm) in FIG. 13A, right. The simulated TE angular reflectivity spectrum of the structure using transfer matrix formalism is shown in FIG. 13A, left. In the spectrum, two kinds of modes are distinguished: one comprises weakly coupled parabolic modes at the upper edge of the DBR upper stopband (USB) extending to both below and above the TIR angle, and the other is bent near the DBP excitonic energy due to the anti-crossing polariton modes (upper polariton branch: UP, lower polariton branch: LP) at $\theta>\theta_{TIR}$. All TE modes are directly visualized by the room temperature, white-light angular reflectivity measurement shown in FIG. 13A, middle. Specifically, the reflectivity dip of the LP is sharp and faint, indicating the high-quality factor of the coupled BSW. The dip of the UP appears above the 0-2 transition, and narrows when approaching higher in-plane momentum, $n_0 \sin\theta$, that is found at higher angles. (Here, $n_0$ is the glass index of refraction.) The presence of the two polariton branches provides clear evidence of strong coupling between photons and excitons, which is absent in previous reports on polariton propagation.

The room temperature TE angular PL emission spectrum of an encapsulated sample was measured using a k-space microscope. As shown in FIG. 13B, there is a significant leakage of exciton emission from the USB at $\theta<\theta_{TIR}$ due to the limited spectral range of the DBR stop band. At $\theta>\theta_{TIR}$, only the lowest polariton branch LP is observed, and the maximum intensity is close to the emission peak of the 0-2 vibronic (FIG. 13A, right), indicating phonon-assisted polariton relaxation.

Figure 3A:
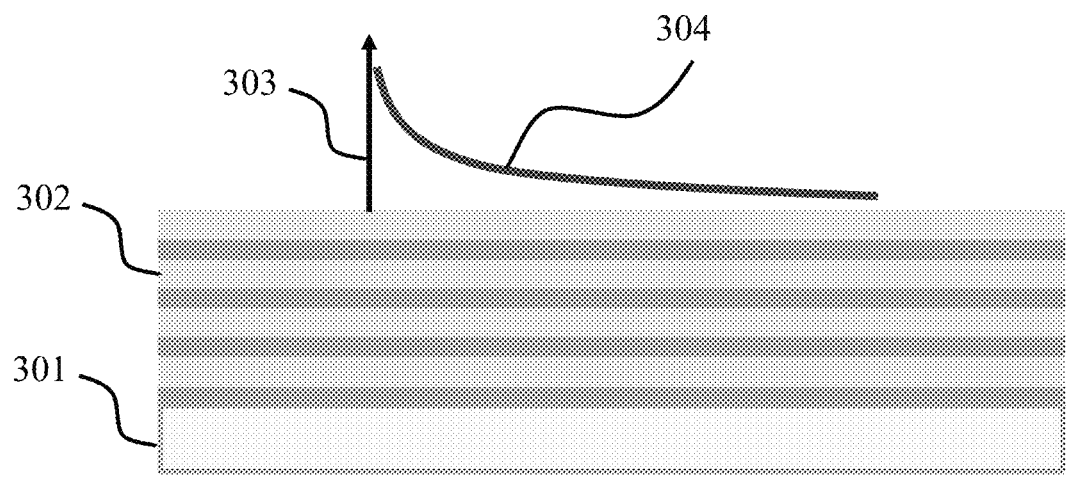
FIG. 3A is an exemplary diagram of polariton propagation.
Figure 3B:
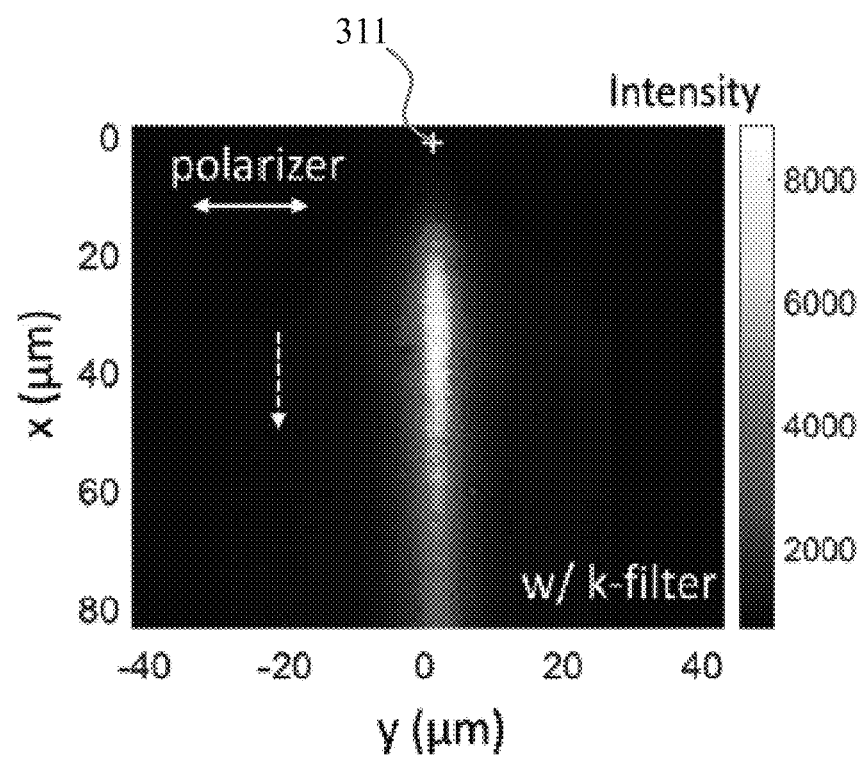
FIG. 3B is a diagram of polariton propagation in an x-y plane.
Figure 14:
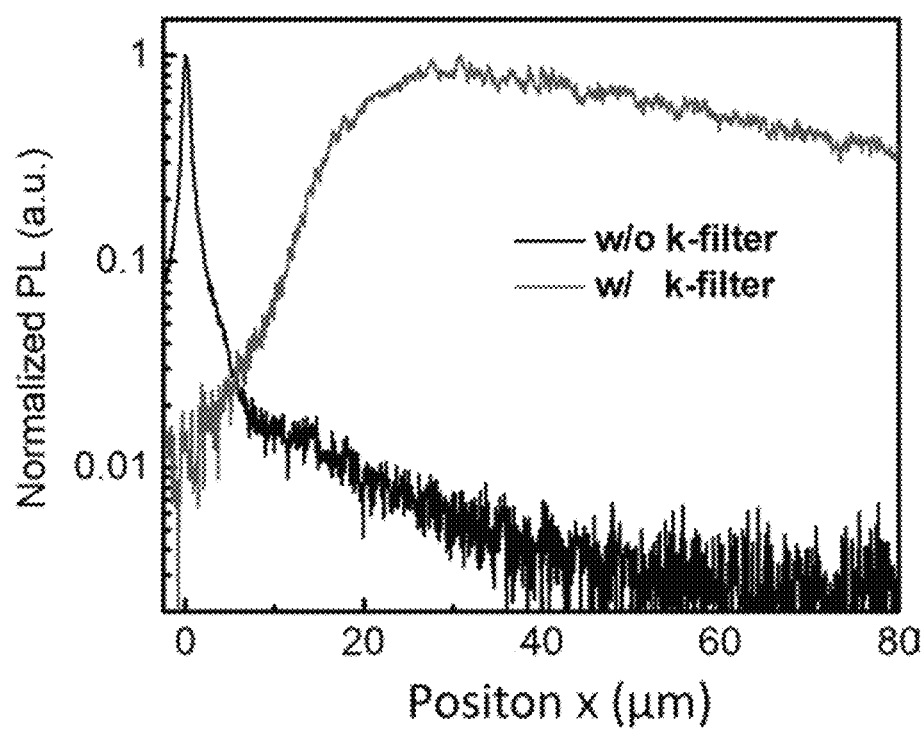
FIG. 14 is a graph of normalized PL over position.

To track the polariton propagation, the spatial distribution of PL was imaged by non-resonantly exciting the sample with a tightly focused laser beam using the setup in the transmission configuration, and the pumping light cannot be coupled into any surface modes of sample due to energy and momentum mismatch. The PL image is now dominated by an intense and bright exciton emission at the excitation spot due to the Gaussian spatial profile of the 1 µm diameter laser beam. Outside of this bright spot, relatively weaker emission radially spreads beyond the field of view. To rule out this weakly coupled exciton emission leakage from the USB, a slit filter was placed in the reconstructed in-plane momentum k-space behind the imaging collection lens in the detection channel, and select only the high-k polariton emission at θ>θ$_{TIR}$. The polariton emission propagating in the direction selected by the slit is shown in FIG. 3B. Surprisingly, the polariton emission intensity was weak near the excitation spot, had a peak at a distance of ≈20-30 µm, and then exponentially decayed along the propagating path beyond the field of view that extends to 80 µm (see FIG. 14). For comparison, the emission profile taken in the absence of a k-space filter is also shown in FIG. 14, where a long and weak emission tail overlaps with the narrow and intense peak at the pumping position.

Figures 15A, 15B:
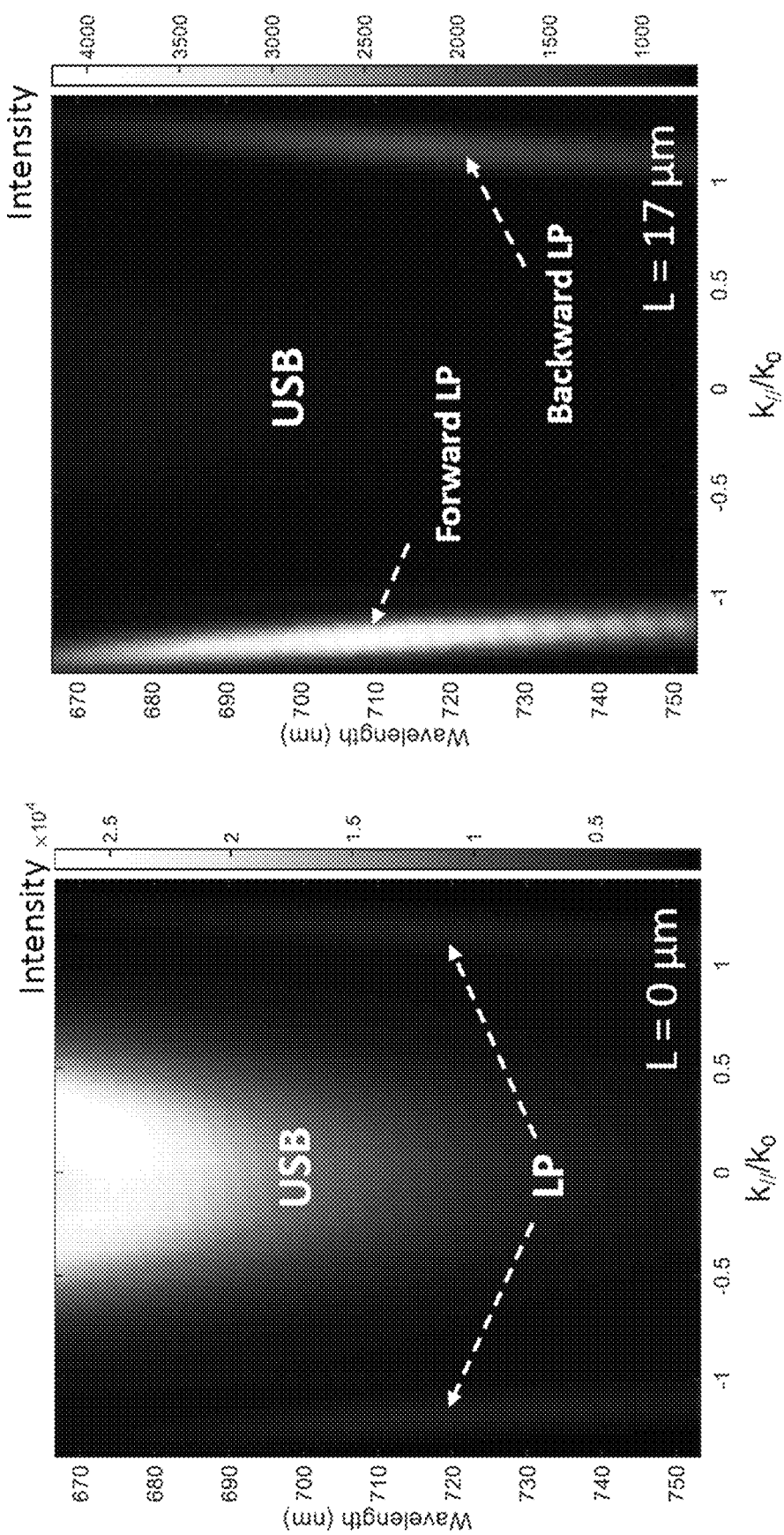
FIG. 15A and FIG. 15B are graphs of intensity.
Figure 16A:
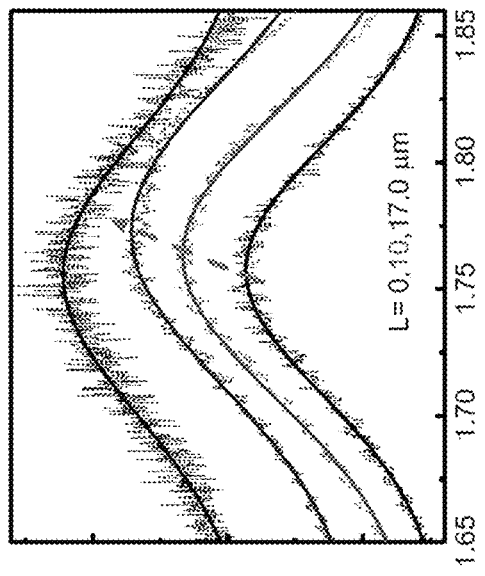
FIG. 16A, FIG. 16B, FIG. 16C, and FIG. 16D are graphs of experimental data.
Figure 16B:
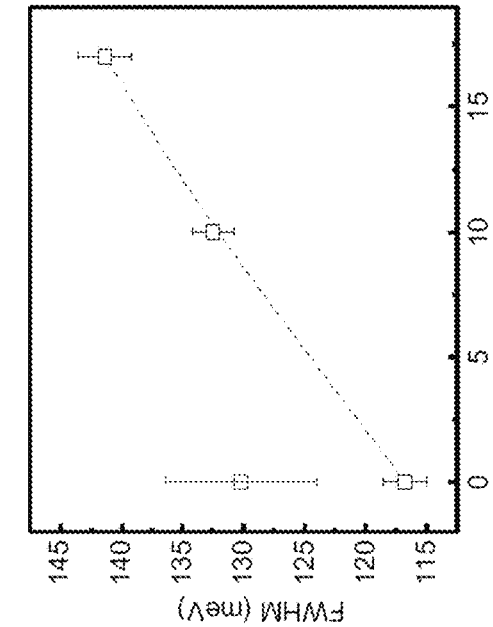
Figure 16C:
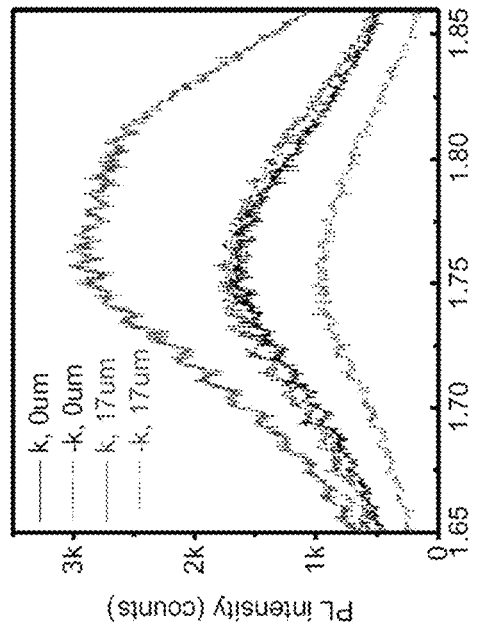
Figure 16D:
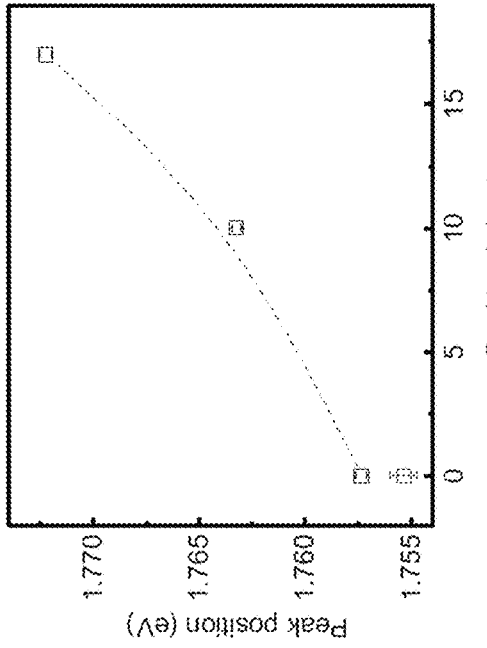

To verify whether the long-range propagation was due to polariton and not guided photons, a portion of area at the intermediate image plane was selected with a pinhole filter to probe the spectral dispersion as a function of position. When the pinhole coincided with the excitation spot corresponding to the observation distance of L=0, a similar angular PL spectrum is obtained in FIG. 15A, although the primary emission is from excitons in the USB rather than from LP. As the pinhole was moved away from the excitation spot along the propagation direction (increasing L), the weight of the polariton emission from LP increased, consistent with the propagation pattern observed in FIG. 3B. At L=17 µm and beyond, the emission is dominated by the forward-propagating LP branch with a negative in-plane momentum shown in FIG. 15B. Note that the pinhole filter caused considerable broadening of the measured polariton modes; however, an energy blue shift of 10-15 meV was observed when polaritons propagated from the pumping center to L=17 µm (see FIG. 16A, FIG. 16B, FIG. 16C, and FIG. 16D), indicating thermal-assisted propagation at room temperature. In addition, much weaker emission from the LP branch corresponding to positive momentum is also observed. This suggests that during propagation, some polaritons back-scatter, and propagate in the opposite direction.

In a microcavity consisting of disordered materials, the incoherent exciton states can strongly interact with a photon, forming coherent polariton states that propagate like a plane wave. However, the intrinsic structural and energetic disorders break the conservation of wave vector, leading to rapid decoherence of the excited states. The microscopic theory of conventional disordered microcavities distinguishes four propagation regimes from zero to large k in the lower polariton branch: Anderson localization of polaritons, inelastic-scattering-dominated polariton propagation, elastic-scattering-dominated polariton propagation, and strong localization of weakly coupled exciton states. In BSW polaritons, the lower boundary of wavevectors is restricted by the total internal reflection angle, θ$_{TIR}$, and the polariton in the first localization regime is replaced by another weakly coupled exciton state. Thus, all BSW polaritons represent propagating modes.

After nonresonant excitation, photogenerated hot excitons rapidly relax to the exciton reservoir where they radiatively decay via weakly coupled localized modes, such as leakage from the USB. At the same time, excitons in the reservoirs populate the LP polariton states via phonon-assisted recombination and/or radiative pumping. As polaritons have large group velocities, they rapidly propagate in-plane, away from the pumping region. Thus, the lifetimes and group velocities of polaritons in the LP branch determine the spatial extent of the quasiparticle distribution.

To calculate the polariton lifetime, the dispersion relation in FIG. 13A is fit with a coupled-oscillator model outside of the rotating-wave approximation for three DBP vibronics, and one BSW photonic oscillator. FIG. 13A (left) shows the four calculated branches (red dashed lines), where the UP and LP dispersions match the measured data, although absorption from the middle polariton (MP) branches is too weak to be observed. The fitting yields a vacuum Rabi-splitting energy of 480+/−50 meV between the 0-0 exciton and the BSW, which is significantly larger than the damping rates of uncoupled excitons and photons, confirming excitation in the strong coupling regime. Moreover, this giant splitting is >20% of the uncoupled 0-0 exciton energy that nominally corresponds to ultrastrong cavity coupling. This ultrastrong-coupled system shows a high excitonic fraction from 20% to 60% in the LP branch from lower to higher k. Considering the lifetimes and fractions of the uncoupled DBP singlet exciton and the BSW photon, the calculated polariton lifetime is 500 fs for the photonic-like LP, and 7 ps for the excitonic-like LP quasiparticles. A group velocity in the LP branch of 0.5-3×10$^7$ m/s was directly measured from the dispersion relation in FIG. 13A.

To understand the polariton propagation pattern, the wavelength-resolved polariton emission profiles in FIG. 17A were measured using the k-space filter. For each wavelength, the signal shows a similar halo-like pattern with the polariton emission maximum located tens of micrometers away from the excitation point, followed by decreasing intensity with distance. The size of the hole decreases with the wavelength (λ), with an approximate radius of 20 µm at a wavelength of λ=670 nm and 10 µm at λ=750 nm. The polariton propagation pattern is attributed to self-interference between two light paths illustrated in FIG. 17B. The polariton mode is either directly excited by the radiation field of an exciton (path 1), or after experiencing TIR (path 2) from the DBP film surface. The phase difference between the two paths results in destructive interference at the pumping site. As the polariton mode propagates beyond the coherence length approximately corresponding to the radius of the halo, the emission intensity rapidly increases to a maximum, followed by an exponential decay due to scattering and non-negligible material absorption.

Figure 17C:
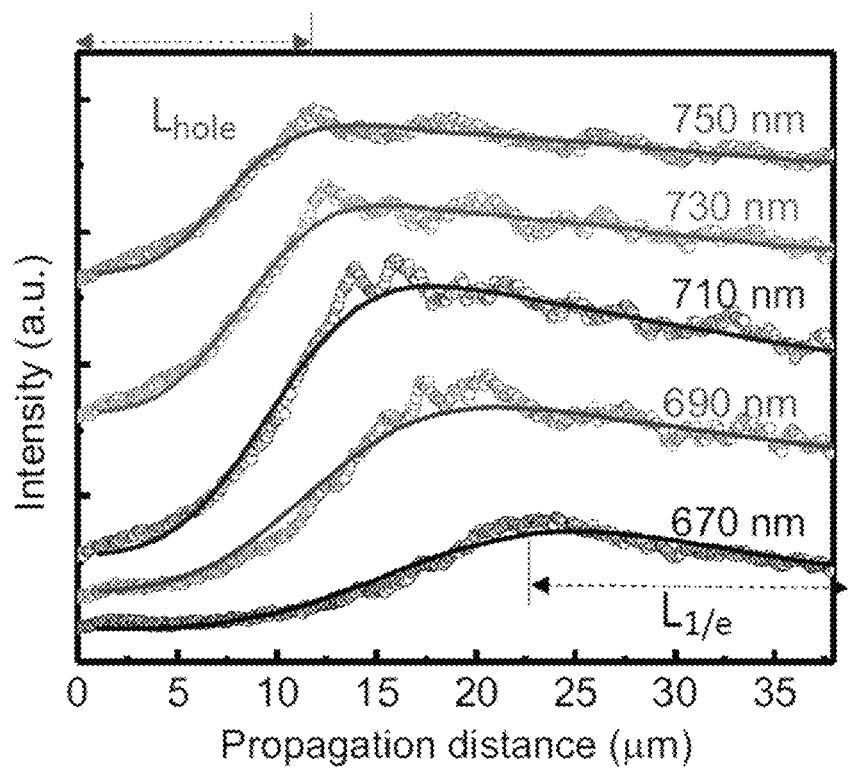
FIG. 17C is a graph of intensity over propagation distance for a set of wavelengths.

For simplicity, a pair of planewave components of the spherical dipole radiation field were taken with the same in-plane momentum and the polariton propagation pattern was calculated. In FIG. 17C, it is shown that the calculation (solid lines) provides a fit to the halo-like profile observed in the wavelength-resolved propagation measurement (data points). The size of the halo, L$_{hole}$, is determined by the coherence length, l$_{coh}$, of polariton propagation, which is limited by decoherence mechanisms including scattering from grain boundaries, surface roughness, and interaction among polaritons and phonons. The hole diameter decreases with increasing wavelength as the polariton mode approaches the air cone at θ$_{TIR}$. A similar halo-like emission intensity pattern was also observed from the TM-guided modes in the same sample, and from the high-k substrate mode in the sample lacking a DBR, both of which are weakly coupled to the DBP exciton radiation field. This supports the disclosed model that the wave-like nature of photons and polaritons leads to the halo propagation patterns.

Figure 17D:
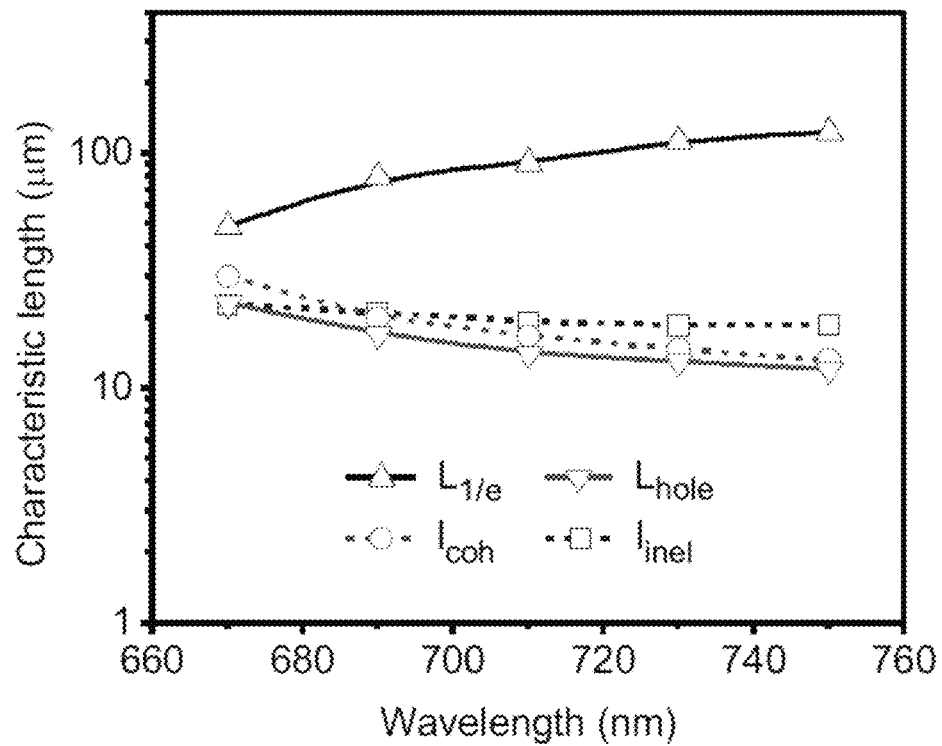
FIG. 17D is a graph of characteristic length for a set of wavelengths.

Polariton propagation is affected by many interacting processes, such as elastic/inelastic scattering and nonlinear polariton interactions. Elastic/inelastic scattering processes are inevitable in organic polaritons due to intrinsic material disorder. Other processes such as interactions with phonons or photons escaping from the cavity contribute to inelastic scattering, and this is confirmed by the energetic blue shift during polariton propagation. The phase-breaking length, l$_{inel}$, for inelastic scattering with the group velocity and lifetime of the polariton was calculated following previous analyses. The phase-breaking length was as long as 23 μm at short wavelengths (large k), and monotonically decreases to 18 μm at a longer wavelengths (smaller k). To gain further understanding of processes limiting the propagation distance, in FIG. 17D, four characteristic lengths were plotted, that is, the coherence length $l_{coh}$ and phase-breaking length $l_{ine1}$, along with the hole size $L_{hole}$, and the total propagation length $L_{1/e}$ as obtained by fitting an exponential to the propagation pattern decay with distance. Clearly, the phase-breaking length $l_{ine1}$ is close to the coherence length $l_{coh}$. The inelastic polariton scattering likely dominates their decoherence, and thus has a significant impact on hole size $L_{hole}$ in the propagation pattern. In contrast, $L_{1/e}$ has a wavelength dependence that differs substantially from the other three lengths. Beyond the halo, other loss processes come into play in attenuating polariton propagation. The decrease in amplitude beyond the halo is ascribed to absorption and resonant scattering by the tail of the density of exciton states, which leads to an ultralong propagation length up to 120 μm.

A blueshift is also observed in the PL spectrum of up to 1 meV when the non-resonant pumping power increases from 0.2 μW to 2 mW. This nonlinear effect mainly comes from interactions of polaritons with a large concentration of localized excitons generated at the reservoir near the pumping spot. However, this blueshift is one order of magnitude smaller than the energy broadening of the polariton modes (≈10 meV), and hence it is less likely to create an effective potential plateau that repels polaritons from the pumping spot. Indeed, the polariton propagation pattern does not change with the pumping power, indicating the nonlinearity plays only a minor role in this case.

In conclusion, disclosed herein is a demonstration of exceptionally long-range, room temperature transport of strongly coupled exciton-polaritons in a one-sided DBR, which are orders of magnitude larger than expected for excitons in disordered organic semiconductors. The observed polariton intensity shows a halo-like pattern that is explained by the self-interference of polariton modes. The disclosed work shows that to realize long-range and efficient polariton transport in disordered systems, it is essential to eliminate the strongly localized polariton components, increase the coherence and phase-breaking lengths, as well as reduce other losses, such as absorption and scattering. Compared with short-range Förster and Dexter-mediated exciton diffusion, polaritons provide an alternative path to transport of excitation energy to a remote location. Furthermore, the simplicity of open dielectric optical structures enables a range of device architectures. For example, the robust nature of polaritons can reduce requirements for use of highly ordered solids, leading to efficient long-range energy harvesting in organic photovoltaics that mimic photosynthetic processes under ambient conditions, while also advancing the understanding of polariton physics.

Device Fabrication

The device was fabricated by sequentially depositing four pairs of a 90 nm-thick ZnS and a 148 nm-thick $MgF_2$ layer, then 20 nm-thick DBP layer on a 180 μm-thick fused silica substrate via thermal evaporation in a vacuum chamber with a base pressure of $10^{-7}$ Torr, and encapsulated using a thin fused silica lid and UV-cured epoxy in an ultrapure $N_2$ environment.

Material Characterization

A 20 nm-thick DBP layer on a fused silica substrate was deposited with the same conditions used for XRD (Rigaku Ultima IV X-ray diffractometer) and AFM characterization (Bruker Dimension Icon, ScanAsyst mode).

Optical Measurements

The angular reflectivity and PL spectra were measured using a k-space microscope comprising an inverted microscope with a 1.40 NA, 100× objective (Olympus), a white lamp source (for reflectivity), TM-polarized λ=532 nm ultrafast pulsed laser source (Toptica Fibre-Pro, for PL), a k-space lens, a TE polarizer, a λ=600 nm long pass filter (for PL), and a spectrometer (Acton SpectraPro SP-2500) with a 1024×1024 CCD camera (PIX 1024B, Princeton Instruments). The PL images were collected by the k-space microscope in a transmission geometry. A 1 μm diameter TM-polarized pulsed Gaussian laser beam was focused on the surface of the DBP layer with a 0.5 NA, 50× objective, from the DBP side, and the emission was collected with another 1.40 NA, 100× objective, from the substrate side. Before projecting it to the spectrometer or camera, delay lenses were used to reconstruct k-space and real-space images, where a slit filter in k-space or a pinhole filter in real-space was placed as designed.

Simulations

Angular reflectivity of the sample was simulated using the transfer matrix method. The propagation pattern of polariton was calculated by a self-interference model.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

REFERENCES

The following publications are incorporated by reference herein in their entireties:

Lidzey, D. G. et al. Strong exciton-photon coupling in an organic semiconductor microcavity. Nature 395, 53-55 (1998).

Holmes, R. J. & Forrest, S. R. Strong exciton-photon coupling in organic materials. Org. Electron. physics, Mater. Appl. 8, 77-93 (2007).

Stranius, K., Hertzog, M. & Börjesson, K. Selective manipulation of electronically excited states through strong light-matter interactions. Nat. Commun. 9, 1-7 (2018).

Polak, D. et al. Manipulating molecules with strong coupling: Harvesting triplet excitons in organic exciton microcavities. Chem. Sci. 11, 343-354 (2020).

Liu, B., Menon, V. M. & Sfeir, M. Y. The Role of Long-Lived Excitons in the Dynamics of Strongly Coupled Molecular Polaritons. ACS Photonics 7, 2292-2301 (2020).

Xu, J. et al. High-Efficiency Second-Harmonic Generation from Hybrid Light-Matter States. Nano Lett. 16, 7352-7356 (2016).

Liu, B., Crescimanno, M., Twieg, R. J. & Singer, K. D. Dispersion of Third-Harmonic Generation in Organic Cavity Polaritons. Adv. Opt. Mater. 7, 1-8 (2019).

Keeling, J. & Kéna-Cohen, S. Bose-einstein condensation of exciton-polaritons in organic microcavities. Annu. Rev. Phys. Chem. 71, 435-459 (2020).

Daskalakis, K. S. et al. Room-temperature superfluidity in a polariton condensate. Nat. Phys. 13, 837-841 (2017).

Sanvitto, D. & Kéna-cohen, S. The road towards polaritonic devices. Nat. Publ. Gr. 15, (2016).
Nikolis, V. C. et al. Strong light-matter coupling for reduced photon energy losses in organic photovoltaics. Nat. Commun. 10, 1-8 (2019).
Genco, A. et al. Bright Polariton Coumarin-Based OLEDs Operating in the Ultrastrong Coupling Regime. Adv. Opt. Mater. 6, 1-6 (2018).
Zasedatelev, A. V. et al. A room-temperature organic polariton transistor. Nat. Photonics 13, 378-383 (2019).
Agranovich, V. M., Litinskaia, M. & Lidzey, D. G. Cavity polaritons in microcavities containing disordered organic semiconductors. Phys. Rev. B—Condens. Matter Mater. Phys. 67, 1-10 (2003).
Rozenman, G. G., Akulov, K., Golombek, A. & Schwartz, T. Long-Range Transport of Organic Exciton-Polaritons Revealed by Ultrafast Microscopy. ACS Photonics 5, 105-110 (2018).
Aberra Guebrou, S. et al. Coherent emission from a disordered organic semiconductor induced by strong coupling with surface plasmons. Phys. Rev. Lett. 108, 1-5 (2012).
Lerario, G. et al. High-speed flow of interacting organic polaritons. Light Sci. Appl. 6, 1-6 (2017).
Hou, S. et al. Ultralong-Range Energy Transport in a Disordered Organic Semiconductor at Room Temperature Via Coherent Exciton-Polariton Propagation. Adv. Mater. 32, 1-6 (2020).
Burlingame, Q. et al. Intrinsically stable organic solar cells under high-intensity illumination. Nature 573, 394-397 (2019).
Liscidini, M., Gerace, D., Sanvitto, D. & Bajoni, D. Guided Bloch surface wave polaritons. Appl. Phys. Lett. 98, (2011).

What is claimed is:

1. An organic photovoltaic device, comprising:
   a substrate;
   a reflector positioned over the substrate;
   a first electrode positioned over at least a first portion of the reflector;
   a polaritonic antenna layer positioned over a second portion of the reflector different from the first portion, electrically connected to the first electrode; and
   at least one unit reaction cell positioned over at least part of the first electrode, the at least one unit reaction cell comprising:
      a heterojunction layer comprising a donor material and an acceptor material, positioned over the first electrode; and
      a second electrode positioned over the heterojunction;
   wherein the polaritonic antenna layer and the reflector are configured to convert incoming photonic energy to polaritons.

2. The organic photovoltaic device of claim 1, wherein the second portion is adjacent to the first portion.

3. The organic photovoltaic device of claim 1, wherein the acceptor material comprises fullerene.

4. The organic photovoltaic device of claim 1, wherein the first electrode is an anode and the second electrode is a cathode.

5. The organic photovoltaic device of claim 4, wherein the anode comprises gold and the cathode comprises silver.

6. The organic photovoltaic device of claim 1, wherein the polaritonic antenna layer comprises tetraphenyldibenzoperiflanthene.

7. The organic photovoltaic device of claim 1, wherein the reflector is a distributed Bragg reflector.

8. The organic photovoltaic device of claim 7, wherein the distributed Bragg reflector comprises at least one pair of sublayers.

9. The organic photovoltaic cell of claim 1, the at least one unit reaction cell comprising an array of unit reaction cells positioned at regular intervals over the first electrode.

10. The organic photovoltaic cell of claim 9, wherein a space between each unit reaction cell in the array of unit reaction cells is between 100 µm and 1 mm.

11. The organic photovoltaic cell of claim 1, wherein the at least one unit reaction cell has a circular cross-sectional area.

12. The organic photovoltaic cell of claim 1, wherein the polaritonic antenna layer comprises the donor material.

13. The organic photovoltaic cell of claim 1, further comprising an electron transport layer between the cathode and the heterojunction layer, and a hole transport layer between the anode and the heterojunction layer.

* * * * *